US010896914B2

(12) United States Patent
Tachikawa et al.

(10) Patent No.: US 10,896,914 B2
(45) Date of Patent: Jan. 19, 2021

(54) SEMICONDUCTOR MEMORY DEVICE

(71) Applicant: TOSHIBA MEMORY CORPORATION, Minato-ku (JP)

(72) Inventors: Takashi Tachikawa, Yokkaichi (JP); Hidenori Miyagawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 152 days.

(21) Appl. No.: 16/110,106

(22) Filed: Aug. 23, 2018

(65) Prior Publication Data
US 2019/0288059 A1 Sep. 19, 2019

(30) Foreign Application Priority Data

Mar. 19, 2018 (JP) ................................ 2018-050724

(51) Int. Cl.
*H01L 27/11582* (2017.01)
*H01L 29/04* (2006.01)
*H01L 23/528* (2006.01)

(52) U.S. Cl.
CPC ...... *H01L 27/11582* (2013.01); *H01L 23/528* (2013.01); *H01L 29/04* (2013.01)

(58) Field of Classification Search
CPC .......... H01L 27/1157; H01L 27/11582; H01L 27/11568; H01L 27/11573;
(Continued)

(56) References Cited

U.S. PATENT DOCUMENTS 9,070,589 B2 * 6/2015 Kawai ................. H01L 27/1157
9,123,749 B2   9/2015 Kawai et al.
(Continued)

FOREIGN PATENT DOCUMENTS

JP      3-228335     10/1991
JP      2008-192890   8/2008
(Continued)

OTHER PUBLICATIONS

Miyasaka, M.. "In situ observation of nickel metal-induced lateral crystallization of amorphous silicon thin films", Applied Physics Letters, vol. 80 No. 6, Feb. 11, 2002, pp. 944-946 with cover page.

*Primary Examiner* — Errol V Fernandes
*Assistant Examiner* — Jeremy J Joy
(74) *Attorney, Agent, or Firm* — Oblon, McClelland, Maier & Neustadt, L.L.P.

(57) ABSTRACT

A semiconductor memory device comprises: a substrate; gate electrodes arranged in a first direction crossing a surface of the substrate; a first semiconductor layer including a first portion extending in the first direction and facing the plurality of gate electrodes, and, a second portion nearer to the substrate than the first portion; a gate insulating film provided between the gate electrode and the first portion of the first semiconductor layer, and, including a memory portion; and, a wiring portion provided between the substrate and the plurality of gate electrodes, connected to the second portion of the first semiconductor layer, and, extending in a second direction crossing the first direction. The wiring portion comprises a second semiconductor layer connected to the second portion of the first semiconductor layer. The second semiconductor layer includes a first crystal grain larger than a thickness in the first direction of the second semiconductor layer.

10 Claims, 38 Drawing Sheets

(58) Field of Classification Search
CPC ......... H01L 23/528–5283; H01L 29/04; H01L 27/11567; H01L 27/11556
See application file for complete search history.

(56) References Cited

U.S. PATENT DOCUMENTS

| | | | |
|---|---|---|---|
| 9,806,091 | B2 | 10/2017 | Miyagawa et al. |
| 2012/0273790 | A1* | 11/2012 | Aoyama ............ H01L 29/66757 257/66 |
| 2014/0227841 | A1* | 8/2014 | Lee .................... H01L 27/11578 438/268 |
| 2015/0083211 | A1 | 3/2015 | Fujimoto et al. |
| 2016/0035741 | A1* | 2/2016 | Tajima ................. H01L 27/1157 257/324 |
| 2016/0071877 | A1* | 3/2016 | Kim ................... H01L 27/11526 257/314 |
| 2017/0040337 | A1* | 2/2017 | Kim ................... H01L 27/11582 |
| 2017/0263626 | A1* | 9/2017 | Okamoto .......... H01L 27/11556 |
| 2017/0271349 | A1* | 9/2017 | Miyagawa ........ H01L 27/11519 |
| 2018/0076213 | A1* | 3/2018 | Kaneko ............. H01L 27/11556 |
| 2020/0051994 | A1* | 2/2020 | Purayath ........... H01L 29/40117 |

FOREIGN PATENT DOCUMENTS

| | | |
|---|---|---|
| JP | 2014-175348 | 9/2014 |
| JP | 2014-179465 | 9/2014 |
| JP | 2015-61064 | 3/2015 |
| JP | 2017-174866 | 9/2017 |

\* cited by examiner

SEMICONDUCTOR MEMORY DEVICE

CROSS-REFERENCE TO RELATED APPLICATIONS

This application is based upon and claims the benefit of Japanese Patent Application No. 2018-050724, filed on Mar. 19, 2018, the entire contents of which are incorporated herein by reference.

BACKGROUND

Field

The embodiment described herein is related to a semiconductor memory device.

Description of the Related Art

In recent years, a semiconductor memory device in which memory cells are arranged three-dimensionally (three-dimensional type semiconductor memory device) has been proposed. Such a semiconductor memory device includes: a substrate; a plurality of gate electrodes arranged in a first direction crossing a surface of the substrate; a semiconductor layer including a first portion extending in the first direction and facing the plurality of gate electrodes, and, a second portion nearer to the substrate than the first portion; a gate insulating film provided between the gate electrode and the first portion of the semiconductor layer, and, including a memory portion; and, a wiring portion connected to the second portion of the semiconductor layer, for example.

Embodiments described later provides a semiconductor memory device including a wiring portion having a low resistance value.

DETAILED DESCRIPTION

A semiconductor memory device according to one embodiment includes: a substrate; a plurality of gate electrodes arranged in a first direction crossing a surface of the substrate; a semiconductor layer including a first portion extending in the first direction and facing the plurality of gate electrodes, and, a second portion nearer to the substrate than the first portion; a gate insulating film provided between the gate electrode and the first portion of the semiconductor layer and including a memory portion; and a wiring portion connected to the second portion of the semiconductor layer. The wiring portion includes a second semiconductor layer connected to the second portion of the first semiconductor layer. The second semiconductor layer includes a first crystal grain larger than a thickness in the first direction of the second semiconductor layer.

Next, the semiconductor memory device according to embodiments will be described in detail with reference to the drawings. Note that the embodiments are merely examples and are not intended to limit the present invention.

Moreover, in this specification, a direction crossing a surface of a substrate is called a first direction, a direction crossing the first direction is called a second direction, and, a direction crossing the first direction and the second direction is called a third direction. In addition, a direction moving away from the substrate along the first direction will be called upward, and, a direction moving towards the substrate along the first direction will be called downward. Moreover, when a lower surface or a lower end is referred to for a certain configuration, this is assumed to mean a surface or an end nearest to the substrate, and, when an upper surface or an upper end is referred to for a certain configuration, this is assumed to mean a surface or an end farthest from the substrate. In addition, a surface intersecting the second direction or the third direction will be called a side surface. In addition, a certain direction parallel to the surface of the substrate will be called an X direction, a direction parallel to the surface of the substrate and perpendicular to the X direction will be called a Y direction, and, a direction perpendicular to the surface of the substrate will be called a Z direction. Note that, although the description below exemplifies a case where the Z direction corresponds to the first direction, the Y direction corresponds to the second direction, and, the X direction corresponds to the third direction. Note that the first, second, and, third directions are not limited to the Z direction, the Y direction, and, the X direction.

First Embodiment

[Configuration]

Figure 1:
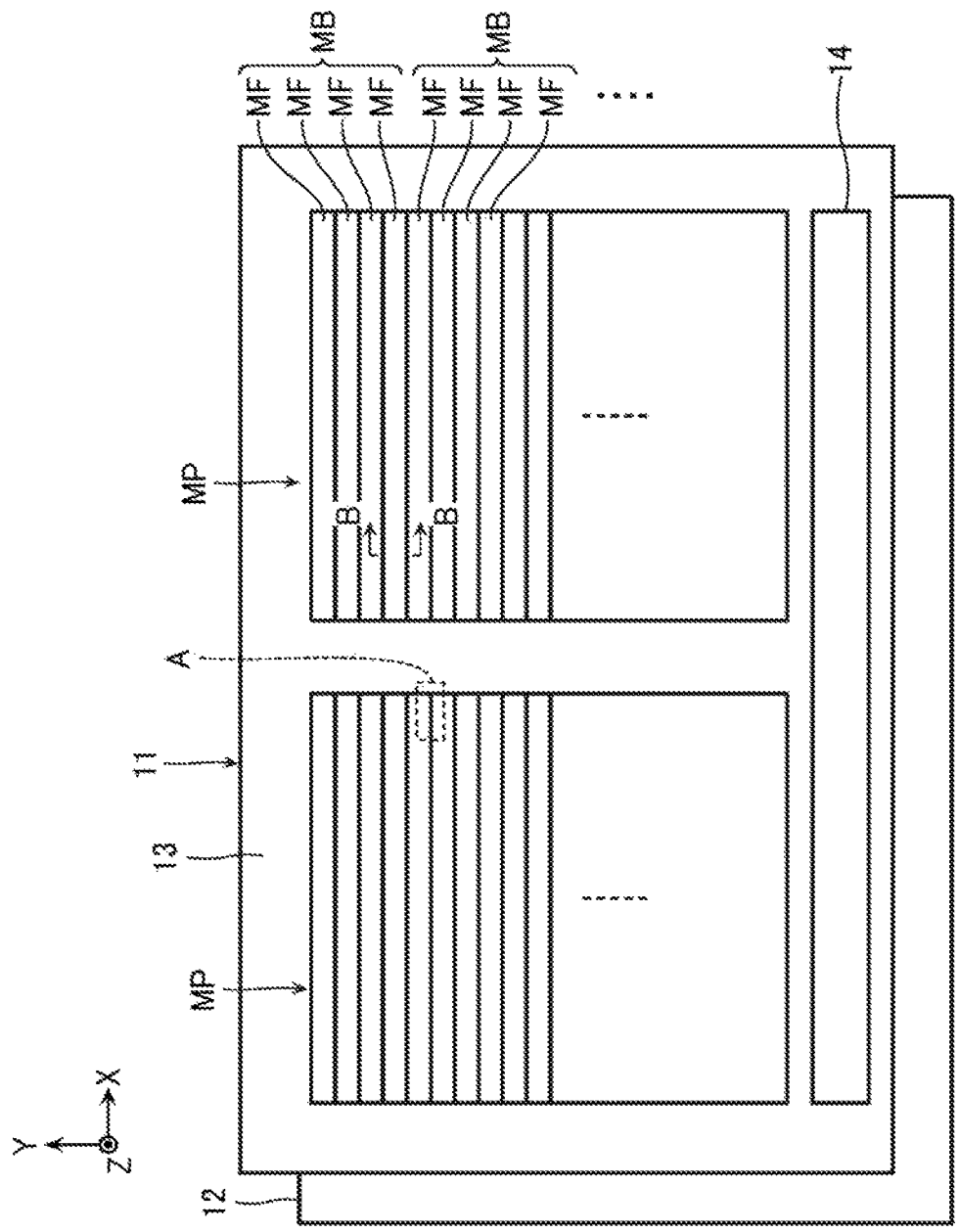
FIG. 1 is a schematic plan view of a semiconductor memory device according to a first embodiment.

FIG. 1 is a schematic plan view of a semiconductor memory device according to a first embodiment.

The semiconductor memory device according to this embodiment includes a memory die 11 and a control die 12. The memory die 11 includes a substrate 13 and includes memory planes MP and a peripheral circuit 14 provided on the substrate 13. The substrate 13 is a semiconductor substrate including single crystal silicon (Si) or the like, for example. The memory plane MP includes a plurality of memory blocks MB arranged in the Y direction. Each of the memory blocks MB includes a plurality of memory fingers MF arranged in the Y direction. The control die 12 controls the memory planes MP via the peripheral circuit 14.

Figure 2:
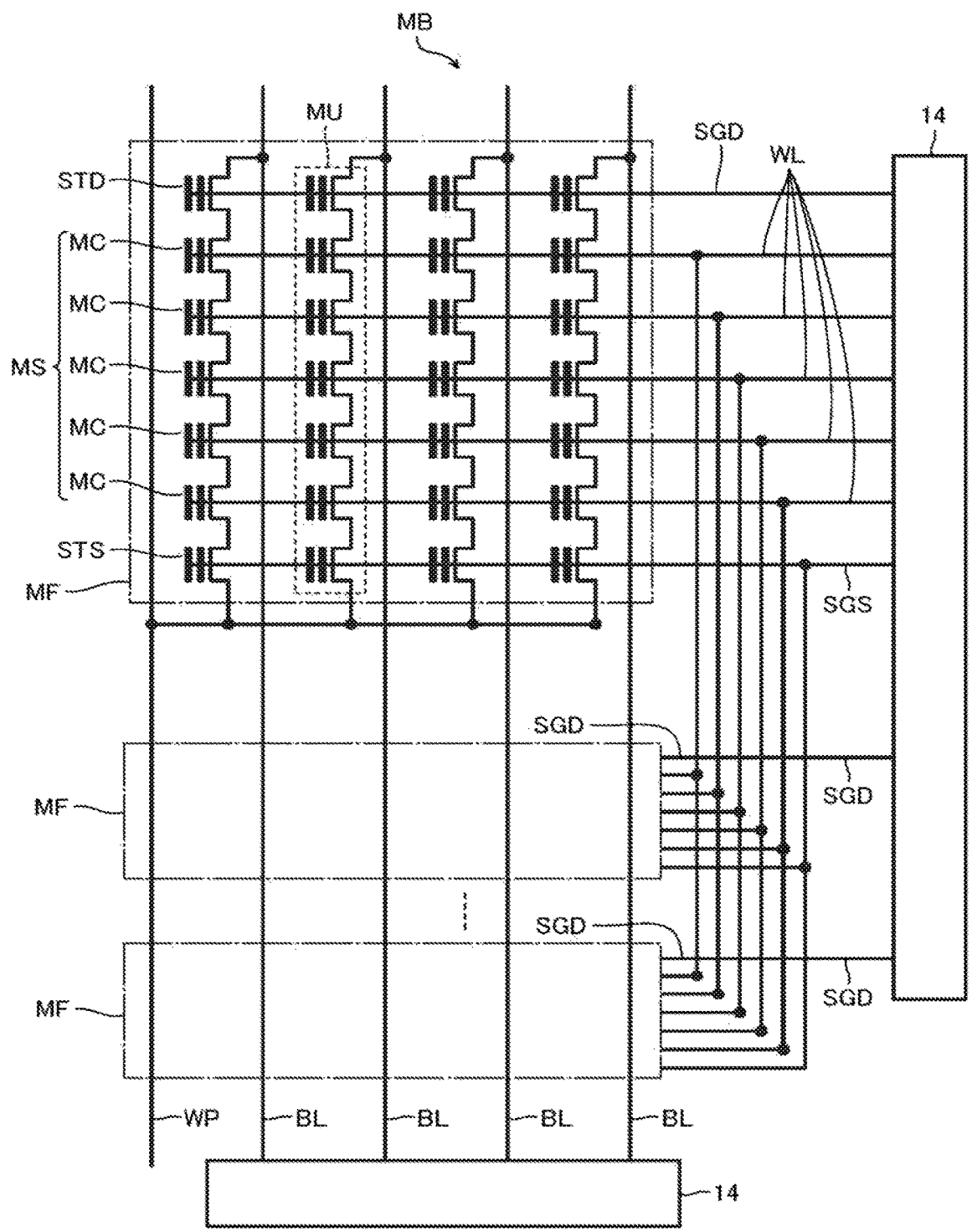
FIG. 2 is a schematic circuit diagram showing a part of a configuration of the semiconductor memory device.

FIG. 2 is an equivalent circuit diagram showing the configuration of the memory block MB. Each of the memory blocks MB is connected to the peripheral circuit 14 via bit lines BL, a wiring portion WP, word lines WL, and, select gate lines (SGS, SGD). Note that, in FIG. 2, part of configuration is omitted for convenience of explanation.

In the memory block MB, each of the plurality of memory fingers MF includes a plurality of memory units MU. Each of the memory units MU includes one end connected to each of the bit lines BL. Moreover, each of the memory units MU includes the other end commonly connected to the wiring portion WP.

The memory units MU includes a drain select transistor STD, a memory string MS and a source select transistor STS connected in series between the bit line BL and the wiring portion WP. Hereinafter, the drain select transistor STD and the source select transistor STS may merely be called select transistors (STD, STS).

The memory string MS includes a plurality of memory cells MC connected in series. Each of the memory cells MC according to this embodiment is a field effect transistor including a first semiconductor layer that functions as a channel region, a gate insulating film including a memory portion, and, a gate electrode. Each of the memory cells MC stores data of 1 bit or more. The memory portion is, for example, an electric charge accumulation layer which can accumulate electric charge. A threshold voltage of the memory cell MC changes according to states of the memory portion. Note that each of the word lines WL is connected to each of the gate electrodes of the plurality of memory cells MC in one memory string MS. Each of the word lines WL is commonly connected to all of the memory units MU in one memory block MB.

The select transistors (STD, STS) are field effect transistors including the first semiconductor layer that functions as a channel region, a gate insulating film and a gate electrode. Each of the select gate lines (SGD, SGS) is connected to each of the gate electrodes of the select transistors (STD, STS). The drain select line SGD is provided corresponding to the memory finger MF, and, is commonly connected to all of the memory units MU in one memory finger MF. The source select line SGS is commonly connected to all of the memory units MU in one memory block MB.

Figure 3:
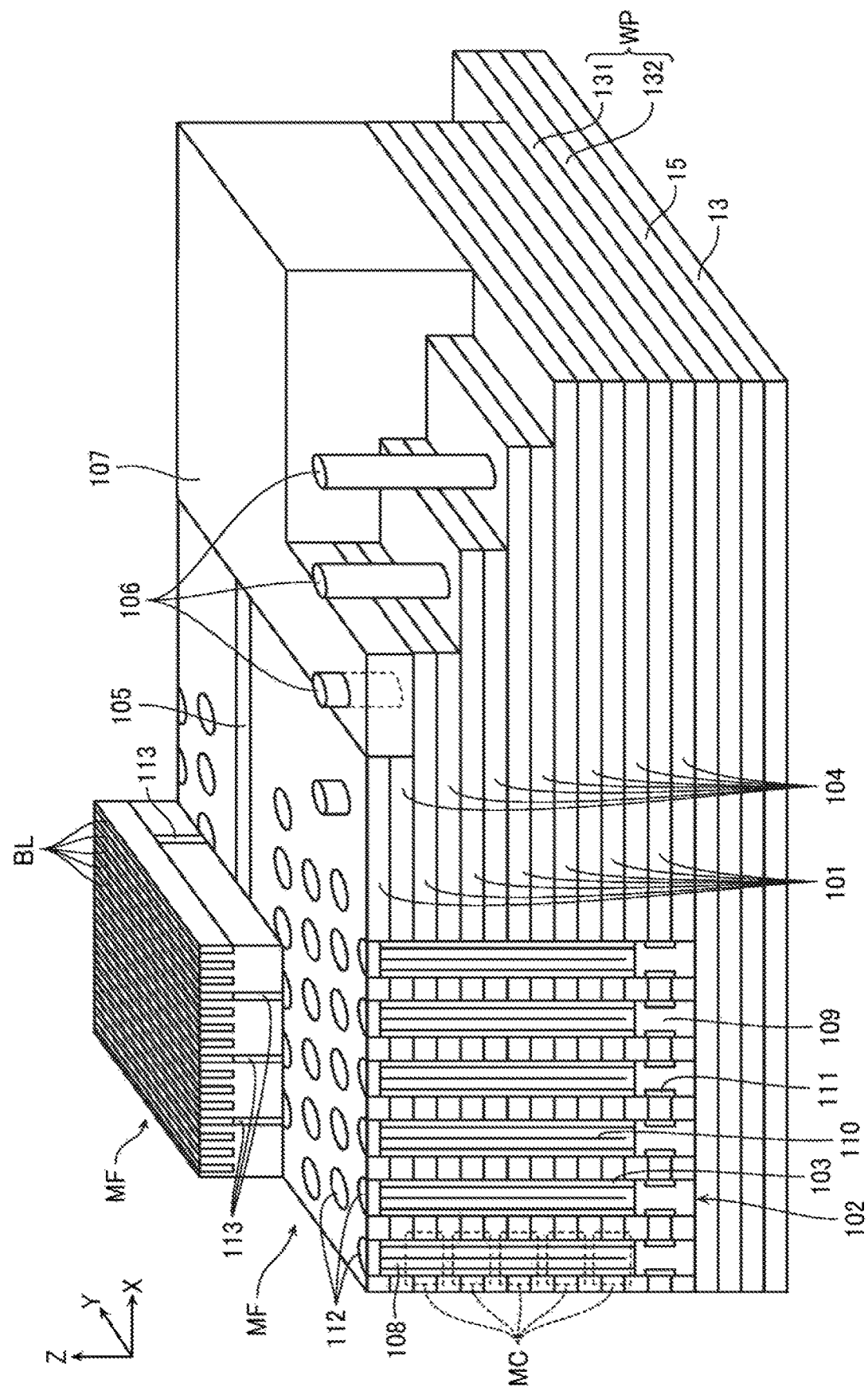
FIG. 3 is a schematic perspective view showing a part of the configuration of the semiconductor memory device.
Figure 4:
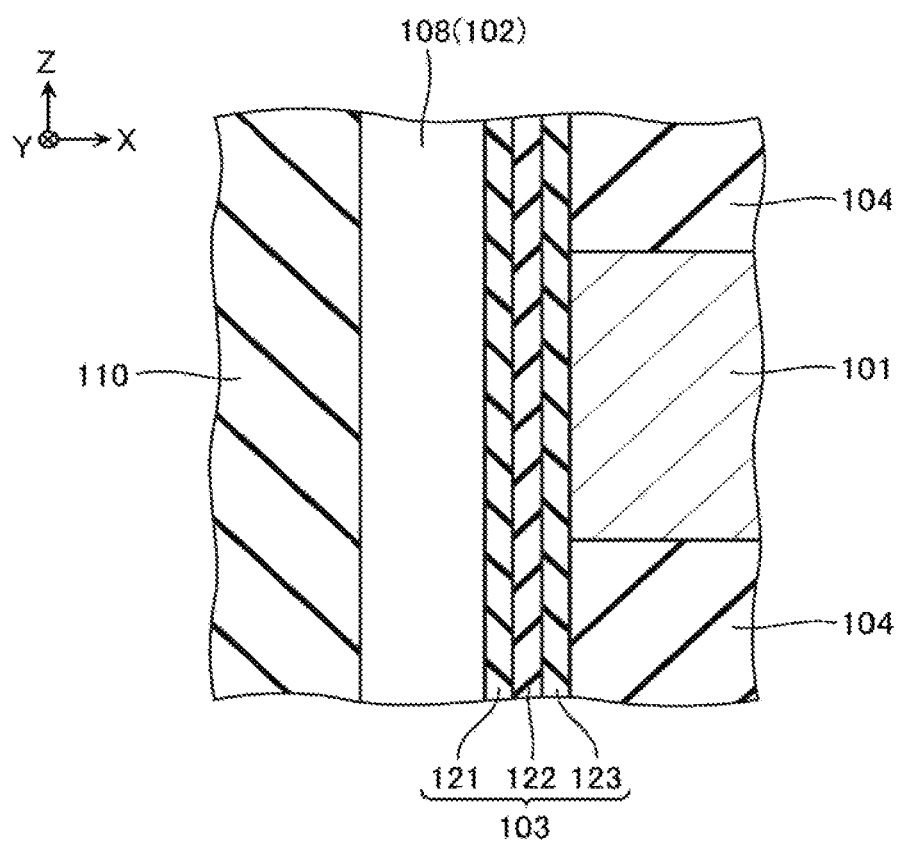
FIG. 4 is an enlarged view of a part of FIG. 3.

FIG. 3 is a schematic perspective view of the semiconductor memory device according to the first embodiment, and, corresponds to the portion shown by "A" in FIG. 1. FIG. 4 is an enlarged view of a part of FIG. 3. Note that in FIG. 3 and FIG. 4, part of configuration is omitted for convenience of explanation.

As shown in FIG. 3, the memory finger MF is provided above the substrate 13. The memory finger MF includes a plurality of conductive layers 101 arranged in the Z direction, first semiconductor layers 102 extending in the Z direction and facing the plurality of conductive layers 101, and, gate insulating films 103 provided between the plurality of conductive layers 101 and the first semiconductor layers 102. Moreover, the wiring portion WP is provided between the substrate 13 and the memory finger MF, and, an insulating layer 15 including silicon oxide ($SiO_2$) or the like is provided between the substrate 13 and the wiring portion WP.

The plurality of conductive layers 101 are plate-like conductive layers extending in the X direction, and, include a laminated film of titanium nitride (TiN) and tungsten (W) or the like, for example. Each of the conductive layers 101 functions as the word line WL and the gate electrodes of the memory cells MC, or, functions as the select gate line (SGD, SGS) and the gate electrodes of the select transistors (STD, STS). Moreover, between the plurality of conductive layers 101, insulating layers 104 including silicon oxide ($SiO_2$) or the like are provided. At least one portion of the plurality of conductive layers 101 and the insulating layers 104 is apart in the Y direction for every memory finger MF via an insulating layer 105. Moreover, positions of the ends in the X direction of the conductive layers 101 differ each other, and, each of the ends of the conductive layers 101 is connected to the peripheral circuit 14 via a contact 106 extending in the Z direction. Moreover, the ends in the X direction of the conductive layers 101 and the contact 106 are covered with an insulating layer 107 including silicon oxide ($SiO_2$) or the like.

The first semiconductor layers 102 are arranged in the X direction and the Y direction. Each of the first semiconductor layers 102 includes a first portion 108 extending in the Z direction and a second portion 109 nearer to the substrate 13 than the first portion 108. The first portion 108 is a semiconductor layer having an approximately cylindrical shape and extending in the Z direction, and, includes a non-doped polycrystalline silicon (p-Si) or the like, for example. The first portion 108 faces the plurality of conductive layers 101 via the gate insulating film 103, and, functions as channel regions of the memory cells MC and the drain select transistor STD. At a center of the first portion 108, an insulating layer 110 including silicon oxide ($SiO_2$) or the like is embedded. The second portion 109 includes single crystal silicon (Si) or the like, and, connected to the first portion 108 and the wiring portion WP, for example. The second portion 109 faces one of the conductive layers 101 nearest to the substrate 13 via the insulating layer 111 including silicon oxide ($SiO_2$) or the like, and, functions as a channel region of the source select transistor STS. An upper end of the first semiconductor layer 102 is connected to the peripheral circuit 14 via a semiconductor layer 112 including impurities of n type such as phosphorus (P), a contact 113, and, the bit line BL extending in the Y direction, for example. A lower end of the first semiconductor layer 102 is connected to the wiring portion WP.

The gate insulating film 103 is provided between the conductive layer 101 and the first portion 108 of the first semiconductor layers 102. As shown in FIG. 4, the gate insulating film 103 includes a tunnel insulating film 121, an electric charge accumulation film 122 and a block insulating film 123 provided on the side surface in the X direction (the Y direction) of the first portion 108 of the first semiconductor layer 102 in order, for example. The tunnel insulating film 121 and the block insulating film 123 include silicon oxide ($SiO_2$) or the like, for example. The electric charge accumulation film 122 includes silicon nitride ($Si_3N_4$) or the like, for example. Note that some or all of the gate insulating films 103 may be divided for every memory cell MC.

The wiring portion WP includes, as shown in FIG. 3, the second semiconductor layer 131 connected to the second portion 109 of the first semiconductor layer 102, and, the metal layer 132 provided between the second semiconductor layer 131 and the substrate 13. The second semiconductor layer 131 includes silicon (Si) or the like in which impurities of n type such as phosphorus (P) are doped, for example. The metal layer 132 includes a laminated film of titanium nitride (TiN) and tungsten (W), or the like, for example. The metal layer 132 is connected to the peripheral circuit 14 via a contact and the like (not shown).

Figure 5:
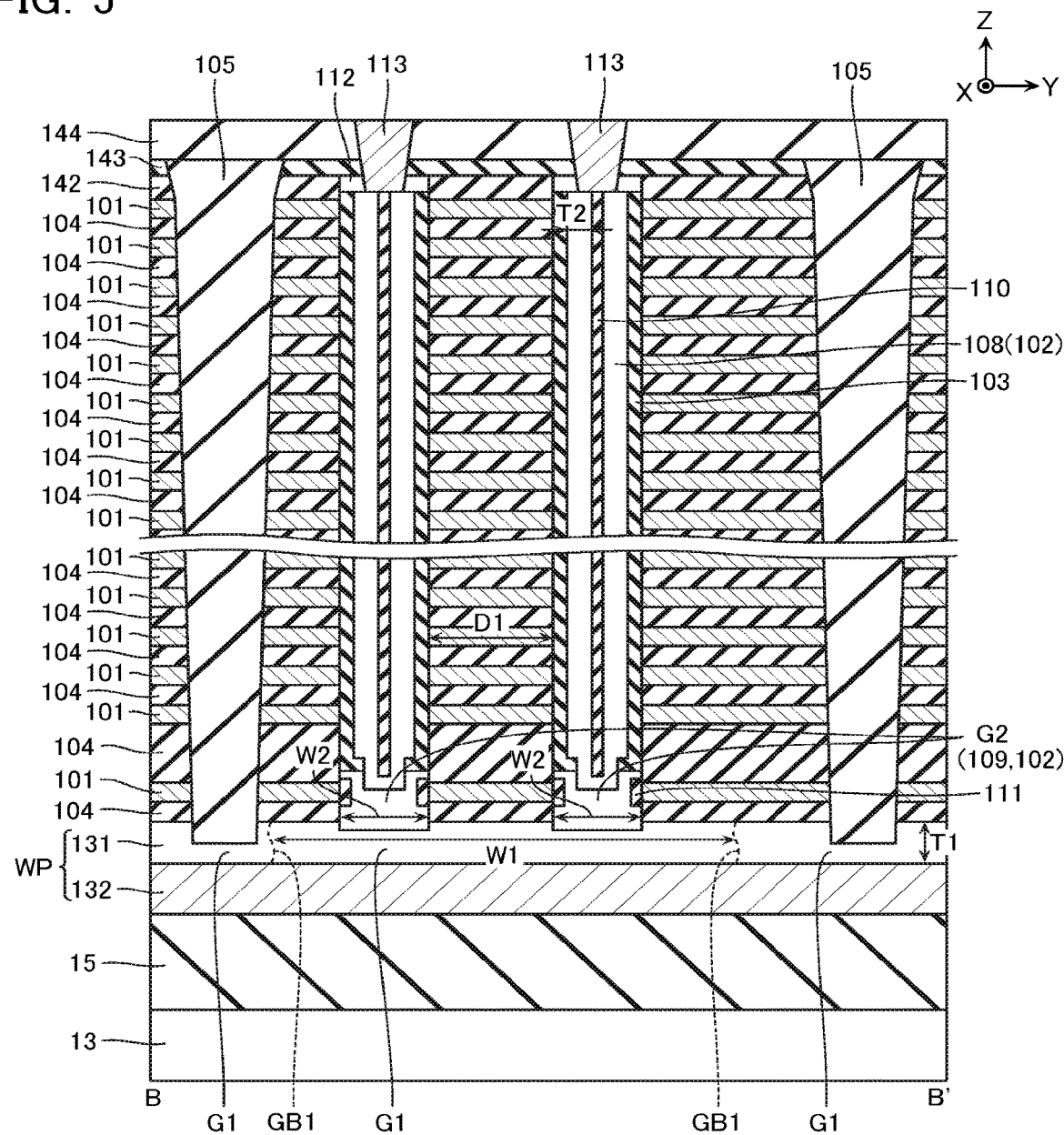
FIG. 5 is a schematic cross-sectional view showing a part of the configuration of the semiconductor memory device.
Figure 6:
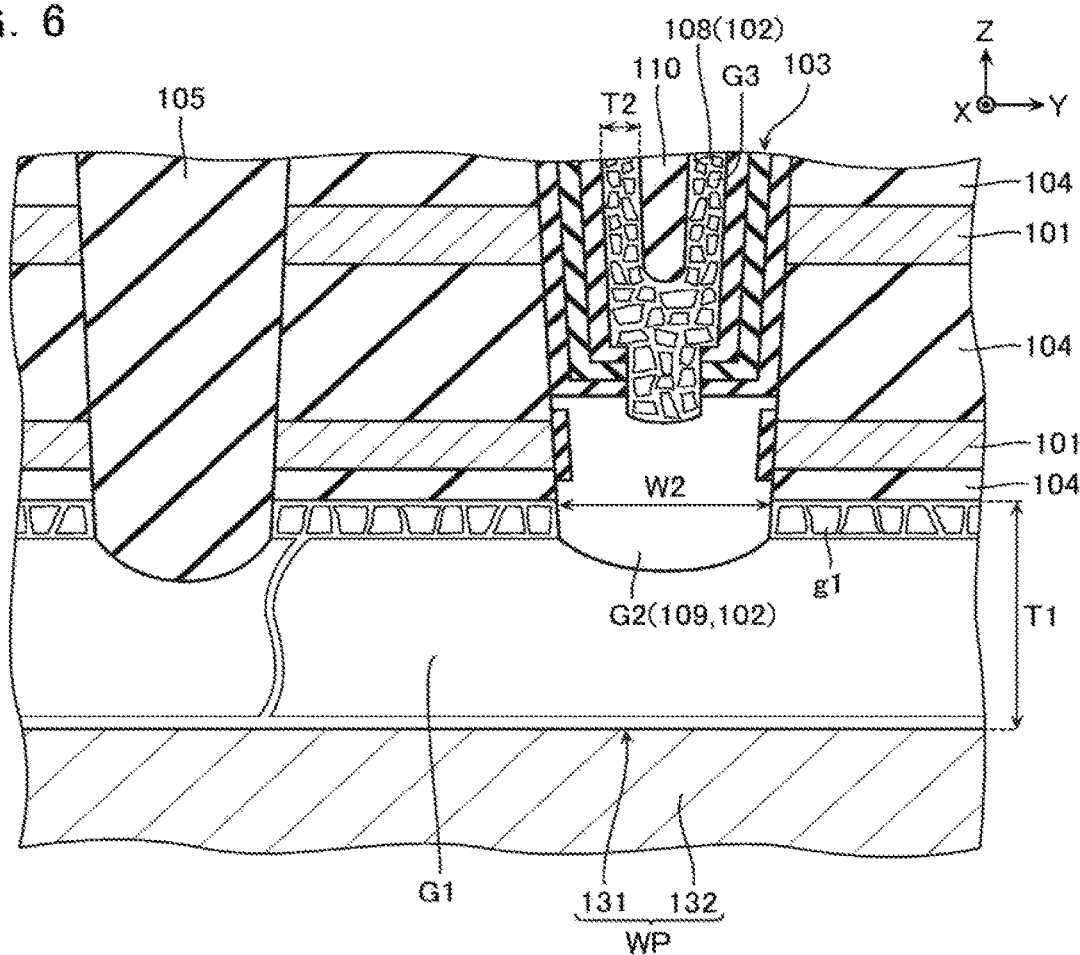
FIG. 6 is an enlarged view of a part of FIG. 5.

Next, with reference to FIG. 5 and FIG. 6, crystal structures and the like of the first semiconductor layer 102 and the second semiconductor layer 131 will be described. FIG. 5 is a schematic cross-sectional view obtained by cutting the portion shown by the B-B' line of FIG. 1, and, seen in the direction shown by the arrows. FIG. 6 is an enlarged view of a part of FIG. 5. Note that, in FIG. 5 and FIG. 6, part of configuration is omitted for convenience of explanation.

Please note that such crystal structures are observed by using methods such as Nano Beam electron Diffraction (NBD) or the like by using Transmission Electron Microscope (TEM) or the like, for example.

Moreover, when size of a crystal grain is referred to below, this is assumed to be a maximum width obtained by measuring a width of the crystal grain from a plurality of directions in an observed cross section.

Additionally, when a "crystal orientation" of a crystal grain is referred to below, this may be an orientation of the crystal grain obtained by measuring it in an observed cross section.

Additionally, when a crystal grain having a crystal orientation "substantially equal to" that of another crystal grain is referred to below, these crystal orientations may be equal. Additionally, for example, if crystal orientation is not uniform in each of the crystal grains due to deformation of the crystal grains or the like, ranges of variations of the crystal orientation in the crystal grains may be overlapped. Additionally, in such a case, crystal orientation may be equal or continuously change in vicinity of a grain boundary between the crystal grains. Additionally, a difference between the crystal orientations of the crystal grains may be less than 10 degrees if it is observed by methods such as NBD or the like.

The second semiconductor layer 131 includes first crystal grains G1 as shown in FIG. 5. The first crystal grains G1 are arranged in the Y direction via grain boundaries GB1. In the illustrated example, the first crystal grain G1 is extending in the Y direction and is connected to the lower ends of a plurality of first semiconductor layers 102. That is, a width W1 in the Y direction of the first crystal grain G1 is larger than a sum of a distance D1 between the first semiconductor layers 102 and a doubled width W2, the width W2 is a width in the Y direction of the first semiconductor layers 102. Moreover, the width W1 in the Y direction of the first crystal grain G1 is larger than a thickness T1 in the Z direction of the second semiconductor layer 131. Note that, although illustration is omitted, a width in the X direction of the first crystal grain G1 is similarly to the width W1 in the Y direction. Moreover, as shown in FIG. 6, in vicinity of the upper surface of the second semiconductor layer 131, crystal grains g1 are provided. The crystal grains g1 are smaller than the thickness T1 in the Z direction of the second semiconductor layer 131. Moreover, the second semiconductor layer 131 may include metal atoms of at least one of nickel (Ni), cobalt (Co), aluminum (Al) and palladium (Pd). Such metal atoms may exist in vicinity of the lower surface of the second semiconductor layer 131, for example.

The second portion 109 of the first semiconductor layer 102 includes a second crystal grain G2. The second crystal grain G2 is larger than the thickness T2 in the Y direction of the first portion 108 of the first semiconductor layer 102. Hereinafter, the thickness T2 may be a distance in the Y direction between the gate insulating film 103 and the insulating layer 110. Moreover, a lower end of the second crystal grain G2 is connected to the first crystal grain G1. Moreover, crystal orientation of the second crystal grain G2 is substantially equal to crystal orientation of the first crystal grain G1 to which the second crystal grain G2 is connected.

The first portion 108 of the first semiconductor layer 102 includes third crystal grains G3. The third crystal grains G3 are smaller than the thickness T2 in the Y direction of the first portion 108.

[Manufacturing Method]

Next, a manufacturing method of the semiconductor memory device according to the first embodiment will be explained.

Figure 7:
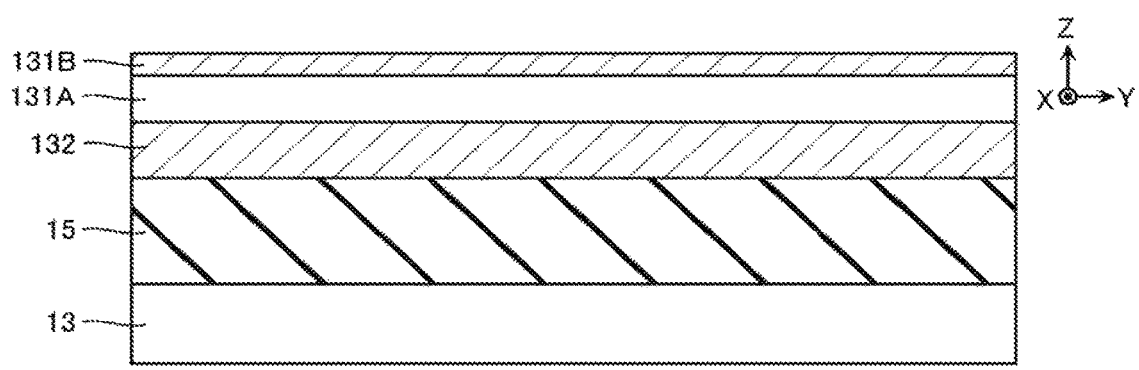
FIG. 7 is a schematic cross-sectional view showing a manufacturing method of the semiconductor memory device.

As shown in FIG. 7, in the manufacturing method, an insulating layer 15, a metal layer 132, an amorphous silicon layer 131A, and, a metal layer 131B are formed on a substrate 13. Formation of the insulating layer 15, the metal layer 132, and, the amorphous silicon layer 131A is performed by a Chemical Vapor Deposition (CVD) or the like, for example. Formation of the metal layer 131B is performed by forming nickel (Ni) or the like by PVD (Physical Vapor Deposition) such as sputtering, for example. Note that the metal layer 131B may include cobalt (Co), aluminum (Al) or palladium (Pd), for example.

Figure 8:
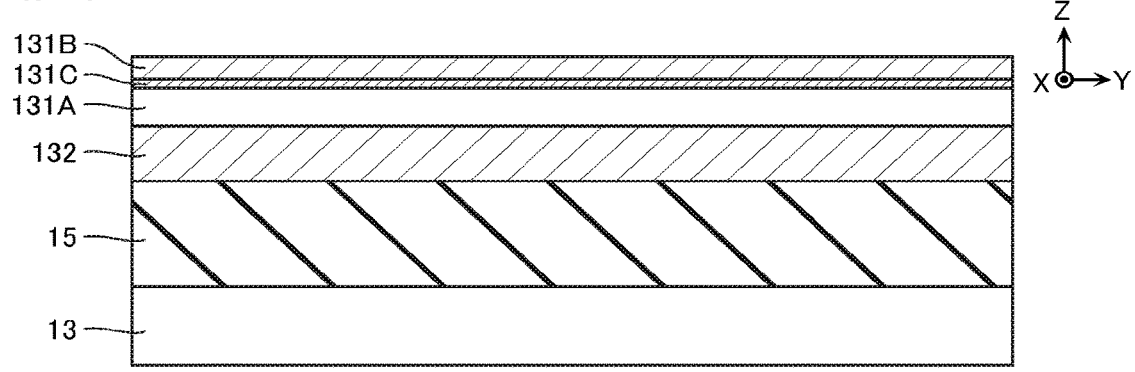
FIG. 8 is a schematic cross-sectional view showing the manufacturing method.

Next, as shown in FIG. 8, a silicide layer 131C is formed in an upper surface of the amorphous silicon layer 131A. The silicide layer 131C is formed by a heat treatment or the like, for example. If the heat treatment or the like is performed, metal atoms in the metal layer 131B diffuse into the amorphous silicon layer 131A to form metal silicide. The silicide layer 131C includes nickel disilicide ($NiSi_2$), for example. After the formation of the silicide layer 131C, the metal layer 131B is removed by wet etching, dry etching, or other means.

Figure 9:
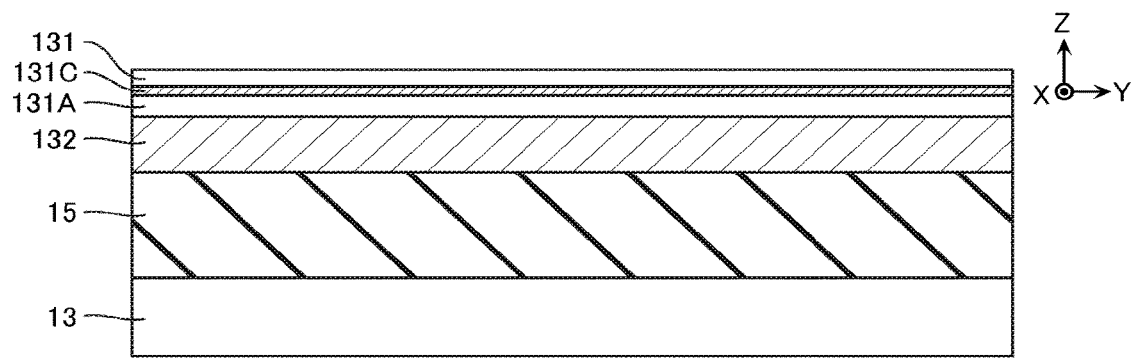
FIG. 9 is a schematic cross-sectional view showing the manufacturing method.
Figure 10:
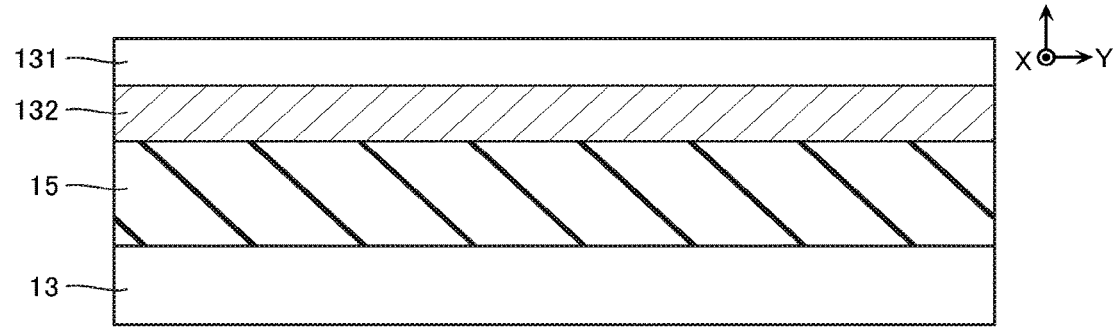
FIG. 10 is a schematic cross-sectional view showing the manufacturing method.

Next, as shown in FIG. 9 and FIG. 10, crystal structure of the amorphous silicon layer 131A is modified to form the second semiconductor layer 131. The modification of the crystal structure is performed by a MILC (Metal Induced Lateral Crystallization) method. In the MILC method, a heat treatment is performed. Thereby, the silicide layer 131C passes through the amorphous silicon layer 131A, and, proceeds toward the metal layer 132. Here, a lattice constant and the crystal structure of nickel disilicide are similar to those of a single crystal of silicon (Si). Therefore, in a portion of the amorphous silicon layer 131A through which the silicide layer 131C passed, the first crystal grains G1 having the large width W1 described with reference to FIG. 5 are formed. On the other hand, in vicinity of the upper surface of the amorphous silicon layer 131A in which the silicide layer 131C is formed before performing the MILC method, the small crystal grains g1 described with reference to FIG. 6 are formed.

Figure 11:
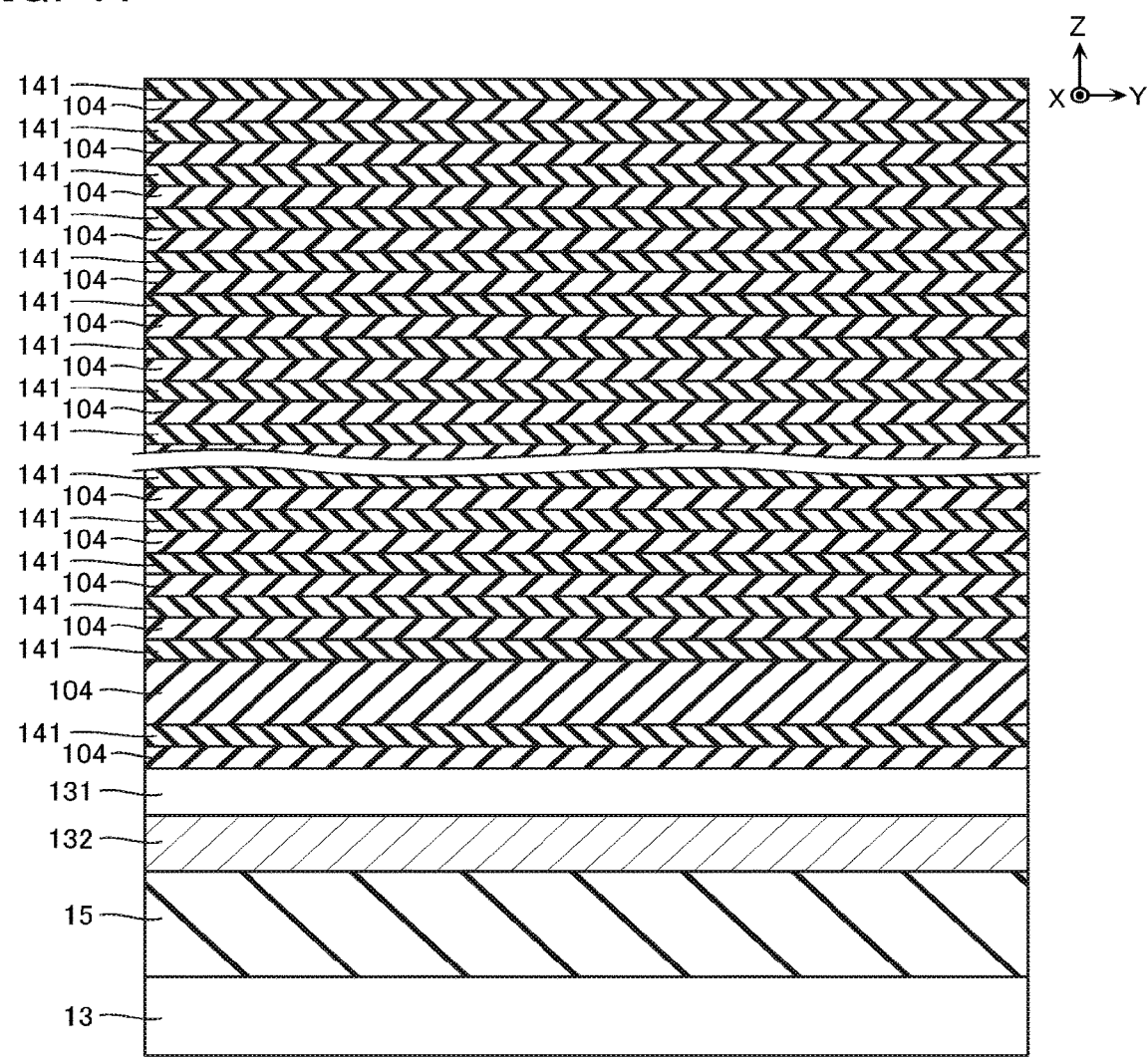
FIG. 11 is a schematic cross-sectional view showing the manufacturing method.

Next, as shown in FIG. 11, a plurality of insulating layers 104 and sacrifice layers 141 are alternately laminated on an upper surface of the second semiconductor layer 131. The insulating layers 104 include insulating layers such as silicon oxide ($SiO_2$), for example. The sacrifice layers 141 include silicon nitride ($Si_3N_4$) or the like, for example. Formation the insulating layers 104 and the sacrifice layers 141 is performed by CVD or the like, for example.

Figure 12:
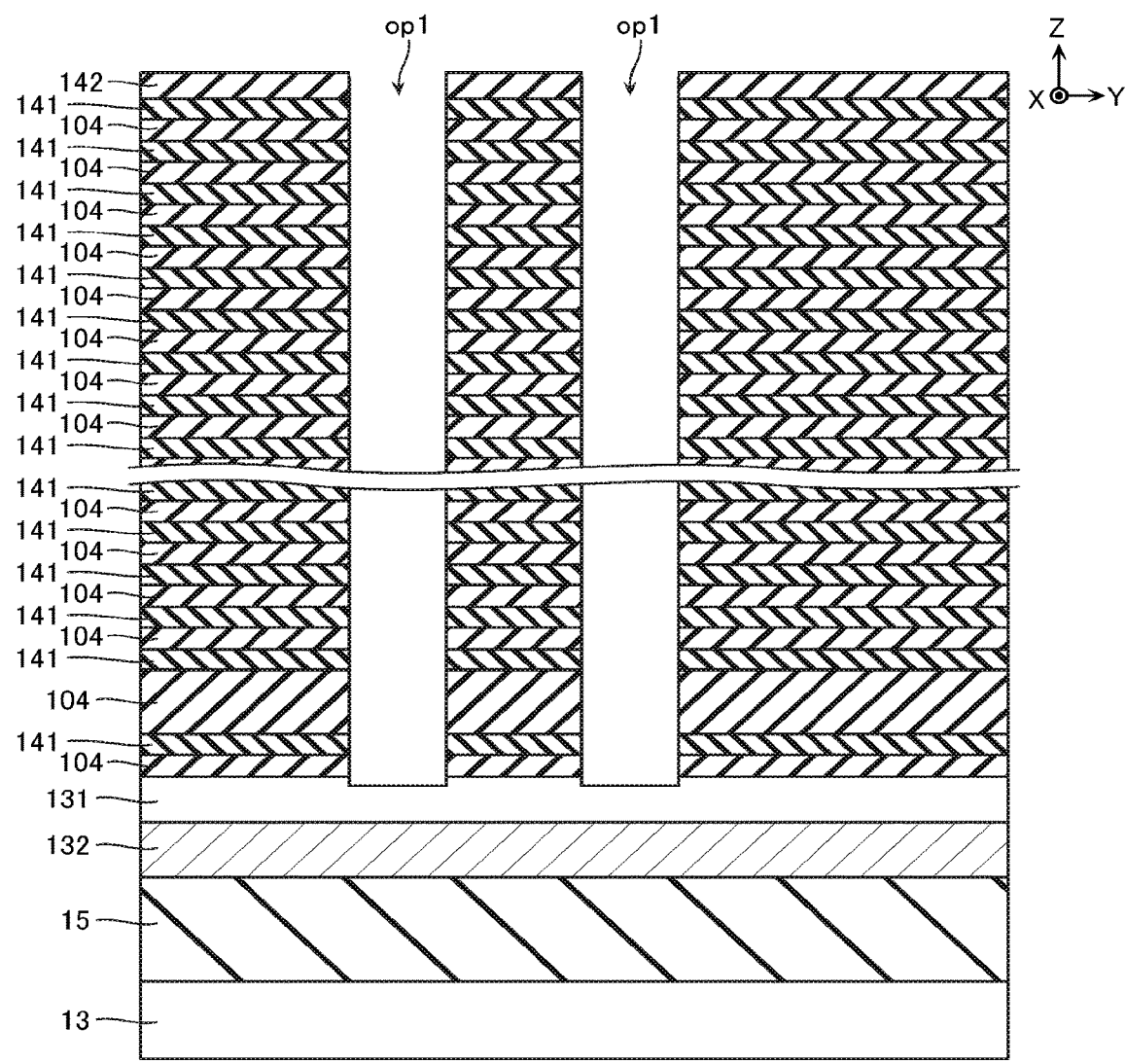
FIG. 12 is a schematic cross-sectional view showing the manufacturing method.

Next, as shown in FIG. 12, openings op1 are formed in the insulating layers 104 and the sacrifice layers 141. The openings op1 are through holes extending in the Z direction, penetrating the insulating layers 104 and the sacrifice layers 141, and, exposing the upper surface of the second semiconductor layer 131. Since the crystal structure of the second semiconductor layer 131 is modified by the MILC method as described above, crystal faces of the first crystal grains G1 are exposed on the bottom surfaces of the openings op1. Note that the openings op1 are formed by forming an insulating layer 142 having openings in portions corresponding to the openings op1 on the upper surface of an uppermost sacrifice layer 141, for example, and, by performing a reactive ion etching (RIE) or the like by using the insulating layer 142 as a mask.

Figure 13:
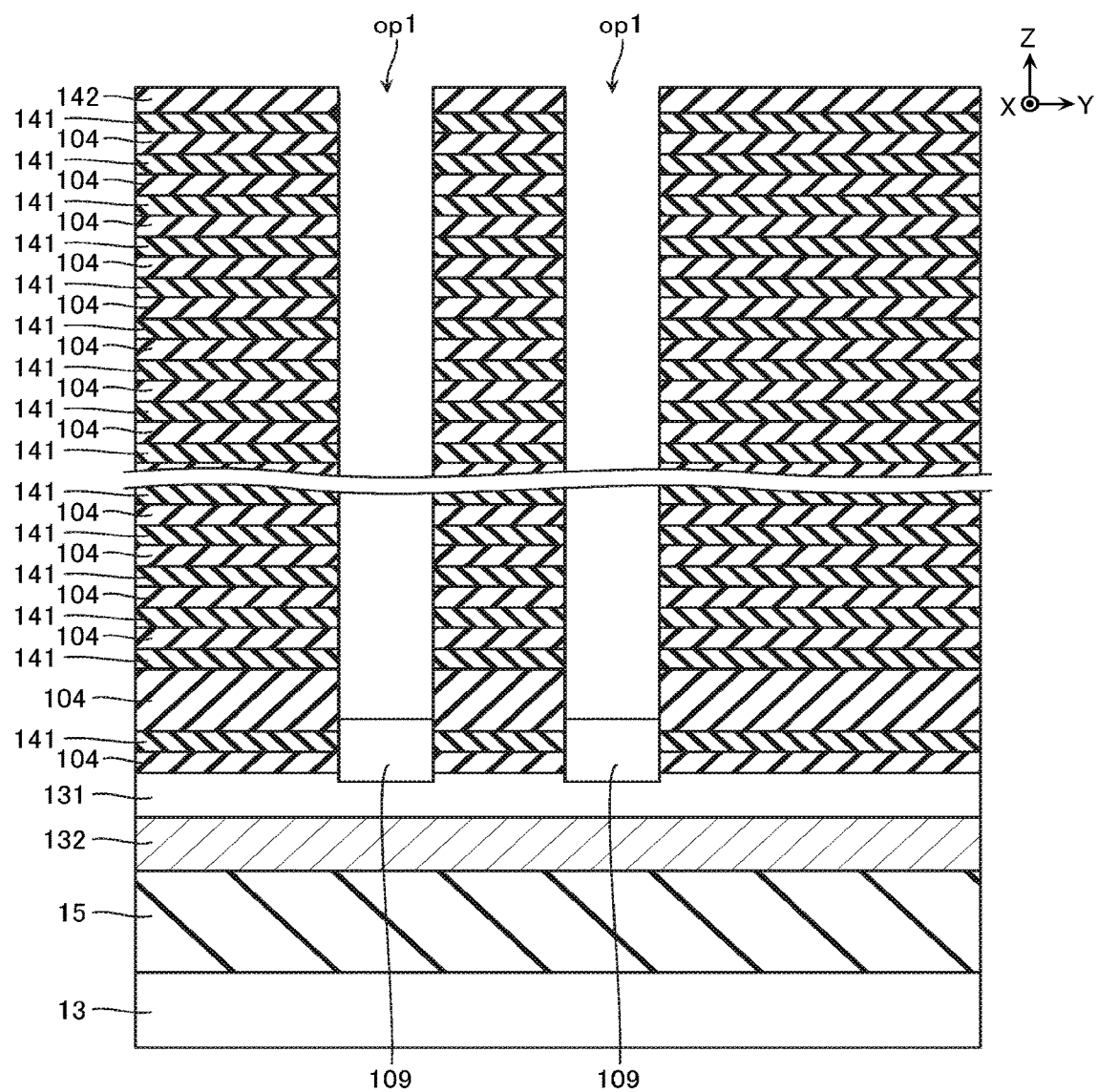
FIG. 13 is a schematic cross-sectional view showing the manufacturing method.

Next, as shown in FIG. 13, second portions 109 of the first semiconductor layers 102 are formed on the bottom surfaces of the openings op1. For example, an epitaxial growth method or the like is performed on basis of the first crystal grains G1 of the second semiconductor layer 131 exposed to the bottom surfaces of the openings op1 (see FIG. 6).

Figure 14:
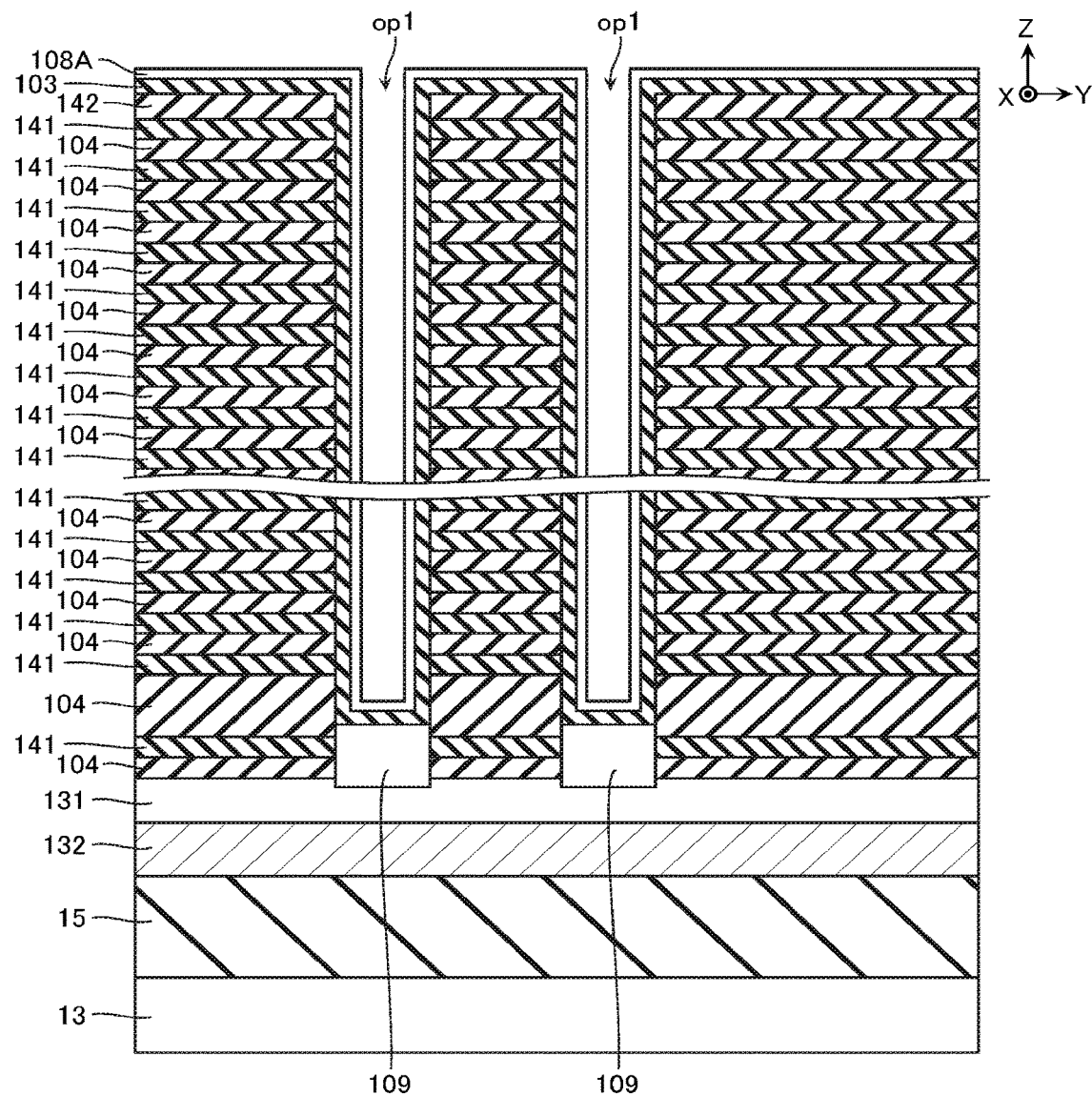
FIG. 14 is a schematic cross-sectional view showing the manufacturing method.

Next, as shown in FIG. 14, a gate insulating film 103 and an amorphous silicon layer 108A are deposited in order on the upper surfaces of the second portions 109, the side surfaces of the insulating layers 104 and the sacrifice layers 141, and, the upper surface of the insulating layer 142. Deposition is performed by a method such as CVD, for example.

Figure 15:
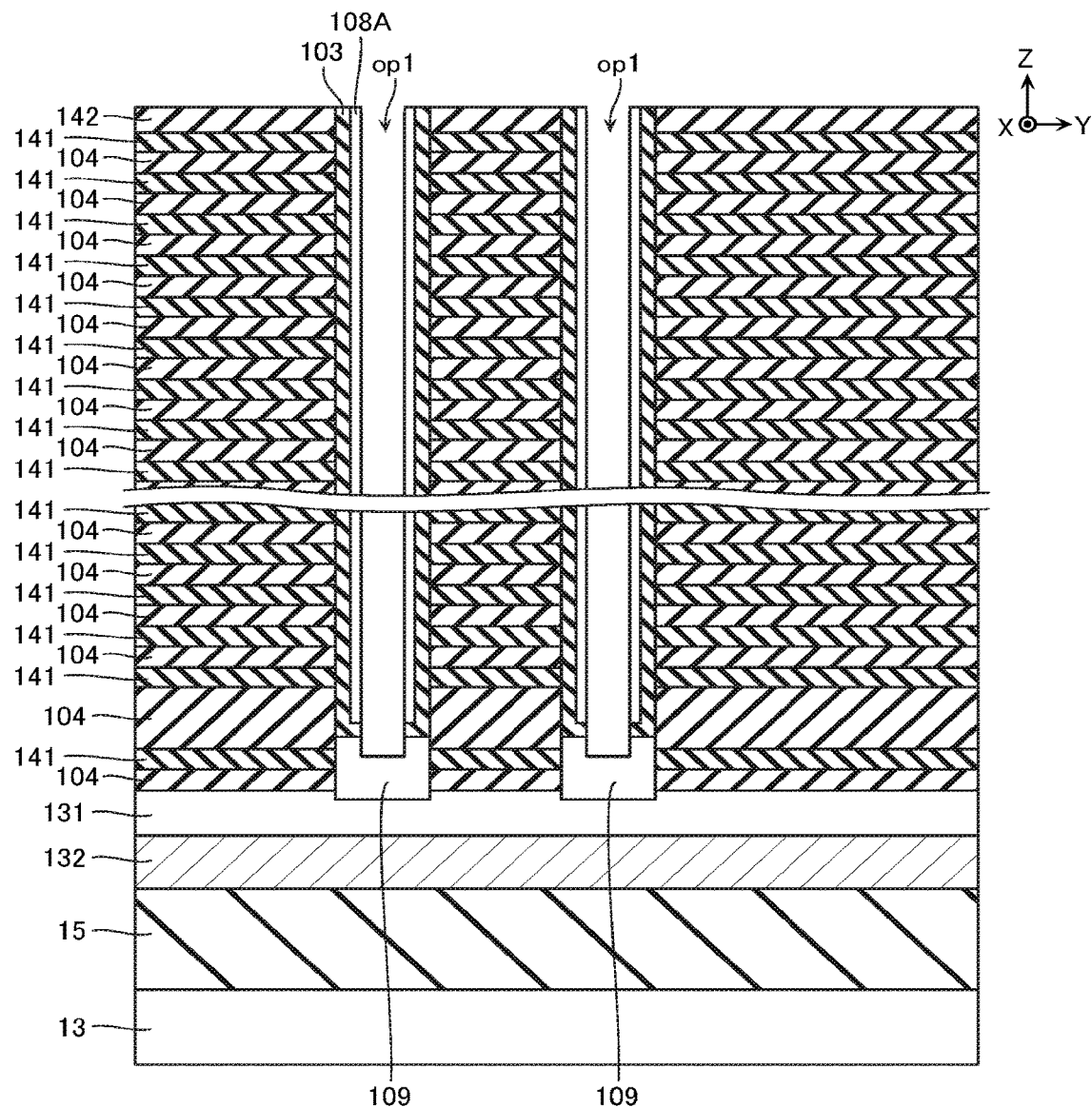
FIG. 15 is a schematic cross-sectional view showing the manufacturing method.

Next, as shown in FIG. 15, portions of the gate insulating film 103 and the amorphous silicon layer 108A covering the upper surfaces of the second portions 109 of the first semiconductor layers 102 and the upper surface of the insulating layer 142 are removed. This process is performed by using a method such as RIE, for example.

Figure 16:
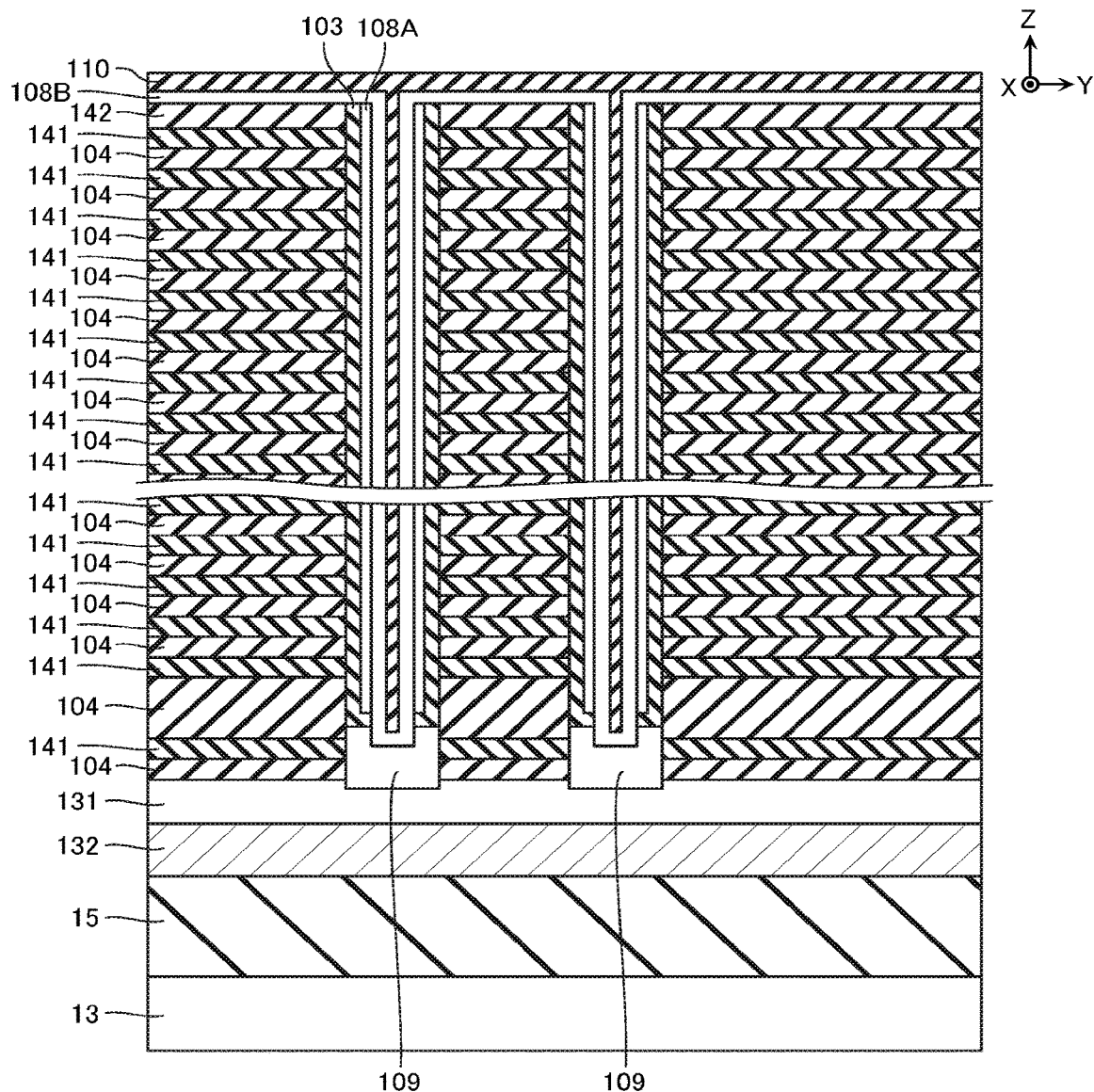
FIG. 16 is a schematic cross-sectional view showing the manufacturing method.

Next, as shown in FIG. 16, an amorphous silicon layer 108B and an insulating layer 110 are deposited on the upper surfaces of the second portions 109 of the first semiconductor layers 102, side surfaces of the amorphous silicon layer 108A, and, the upper surface of the insulating layer 142. Deposition is performed by a method such as CVD, for example.

Figure 17:
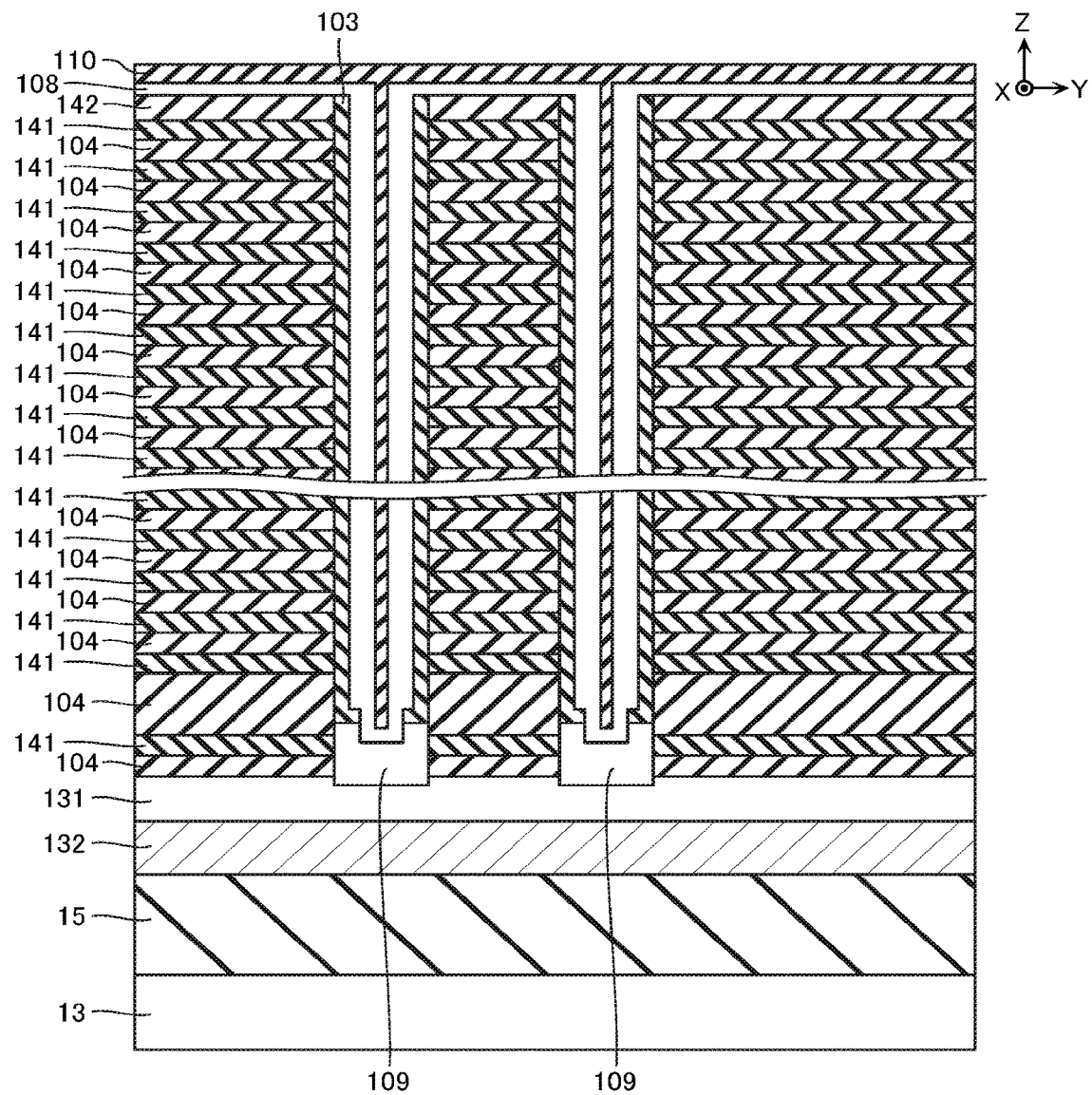
FIG. 17 is a schematic cross-sectional view showing the manufacturing method.

Next, as shown in FIG. 17, crystal structures of the amorphous silicon layer 108A and the amorphous silicon layer 108B are modified by an annealing treatment or the like to form the first portions 108 of the first semiconductor layers 102.

Figure 18:
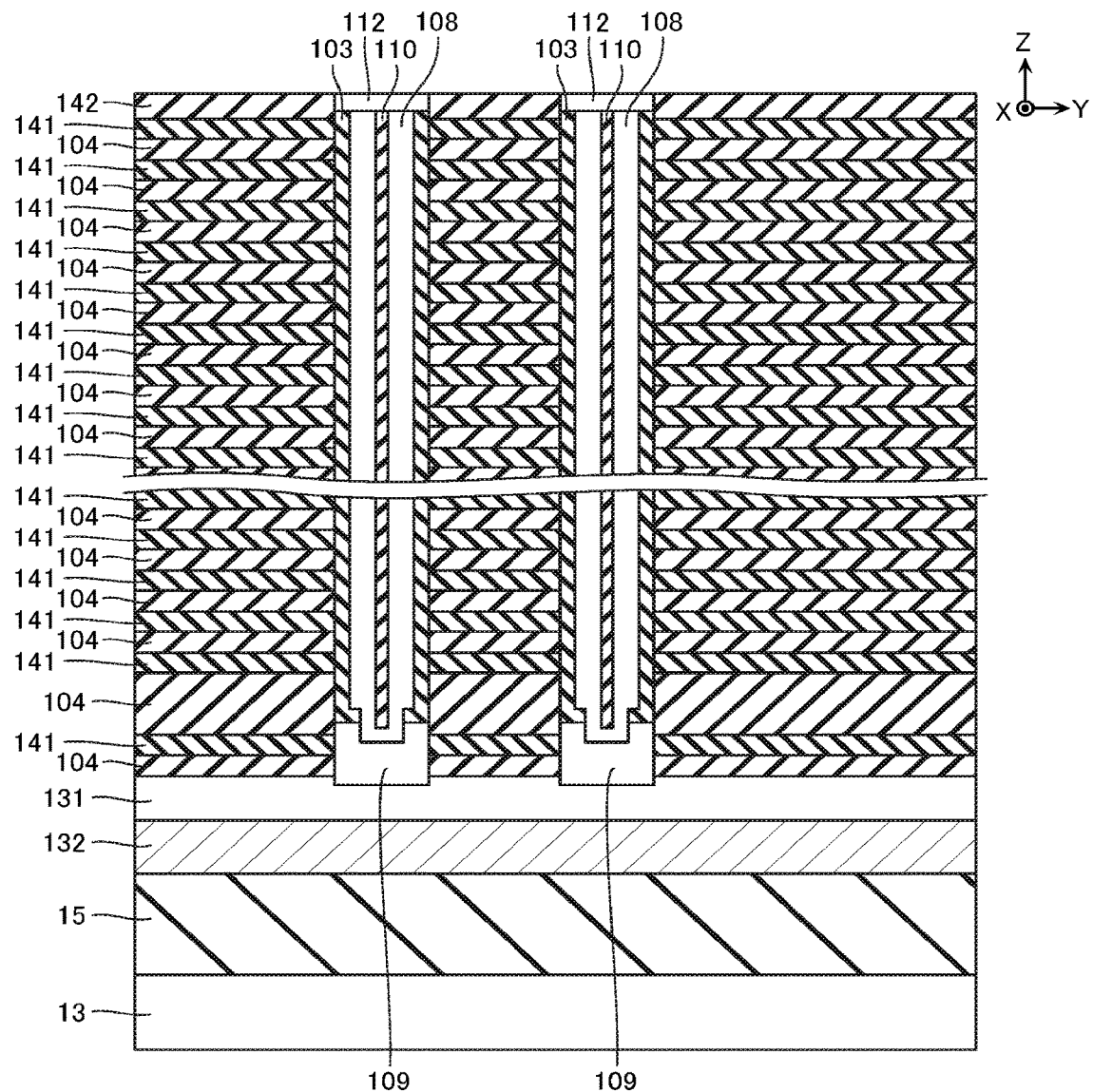
FIG. 18 is a schematic cross-sectional view showing the manufacturing method.

Next, as shown in FIG. 18, portions of the first portion 108 and the insulating layer 110 covering the upper surface of the insulating layer 142 are removed. This process is performed by using RIE or the like, for example. Moreover, semiconductor layers 112 including impurities of n type such as phosphorus (P) are formed on the upper surface of the first portion 108.

Figure 19:
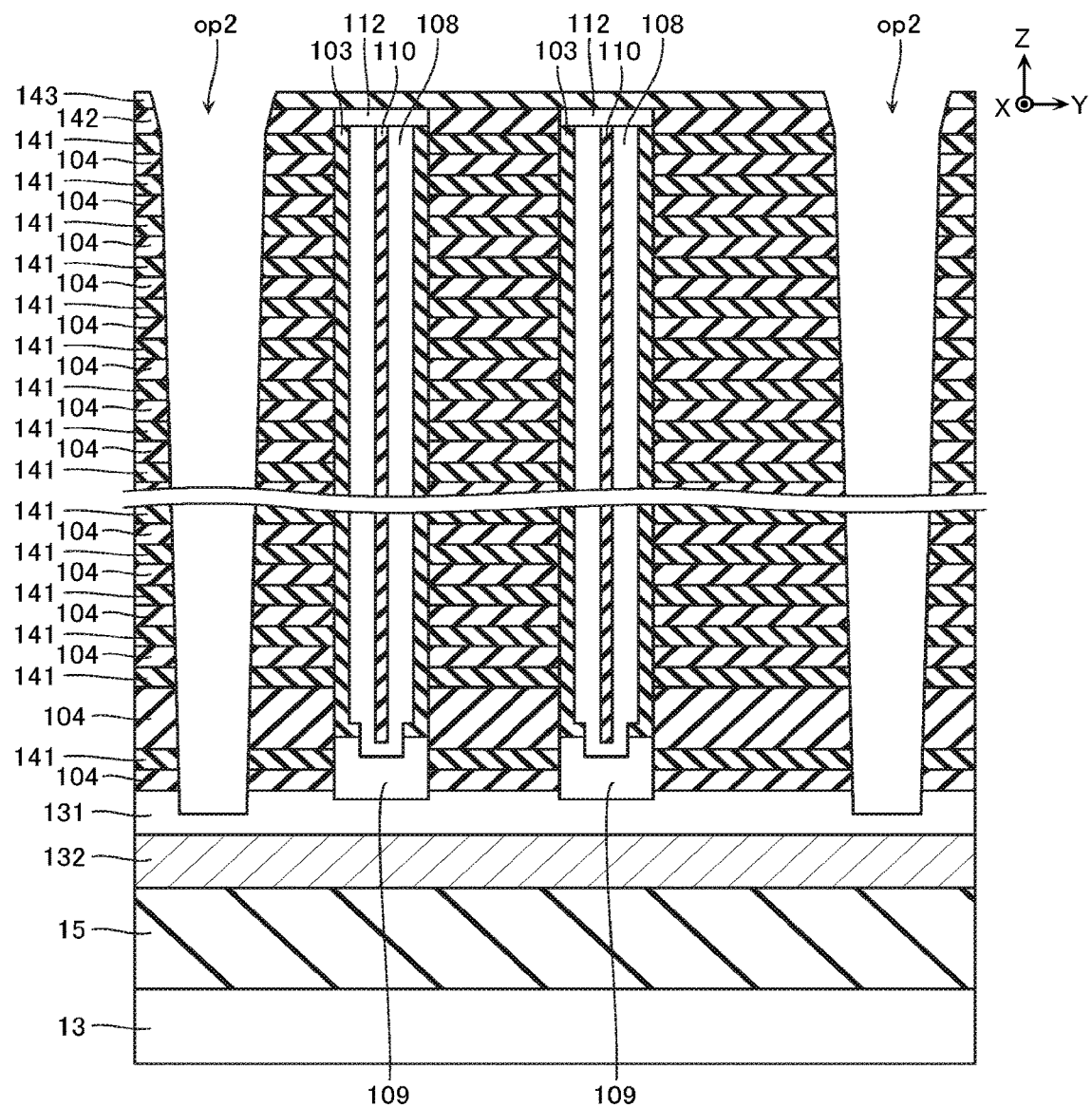
FIG. 19 is a schematic cross-sectional view showing the manufacturing method.

Next, as shown in FIG. 19, openings op2 are formed in the insulating layers 104 and the sacrifice layers 141. The openings op2 are slits extending in the Z direction and the X direction, dividing the insulating layers 104 and the sacrifice layers 141 in the Y direction, and, exposing the upper surface of the second semiconductor layer 131. The openings op2 are formed by forming an insulating layer 143 having slits in portions corresponding to the openings op2 on the upper surface of the insulating layer 142, for example, and, by performing RIE method or the like using the insulating layer 143 as a mask.

Then, the sacrifice layer 141 is removed by wet etching or the like via this opening op2, an insulating layer 111 is formed by oxidation treatment, the conductive layers 101 are formed between the insulating layers 104 adjacent in the Z direction, insulating layers 105 are formed in the openings op2, and, contacts, wirings and the like are formed, thereby manufacturing the semiconductor memory device according to this embodiment.

[Advantages]

As described with reference to FIG. 3, the wiring portion WP according to the first embodiment includes the second semiconductor layer 131 connected to the second portion 109 of the first semiconductor layers 102. Moreover, as described with reference to FIG. 5, the second semiconductor layer 131 includes the first crystal grain G1, and, the first crystal grain G1 is larger than the thickness T1 in the Z direction of the second semiconductor layer 131. In such a configuration, it is possible to decrease a resistance in the second semiconductor layer 131 as compared with a case where the second semiconductor layer 131 does not include the first crystal grain G1, for example. Thereby, it is possible to provide a semiconductor memory device including a wiring portion having a low resistance value.

The second semiconductor layer 131 including such first crystal grain G1 can be easily realized by the MILC method described above. By the MILC method described above, at least one metal of nickel (Ni), cobalt (Co), aluminum (Al) and palladium (Pd) may be used as the metal layer 131B (FIG. 7 and other drawings) for forming the silicide layer 131C. In such a case, the second semiconductor layer 131 may include metal atoms of these metals.

Moreover, in this embodiment, the wiring portion WP includes the metal layer 132, and, the metal layer 132 is formed on the lower surface of the second semiconductor layer 131. In such a configuration, it is possible to use the metal layer 132 having a low resistance mainly as a wiring and decrease a contact resistance between the first semiconductor layers 102 and the metal layer 132 by the second semiconductor layer 131, and, it is possible to provide the wiring portion WP having a low resistance.

Here, in order to form the wiring portion WP having such a laminated structure, it can also be considered that the amorphous silicon layer 131A is formed on the upper surface of the metal layer 132, and, crystal structure of this amorphous silicon layer 131A is modified by annealing treatment such as RTA (Rapid Thermal Annealing), for example. However, crystal grains formed by such an annealing treatment tend to be smaller than a width in the Y direction of the openings op1 (substantially the same as W2 in FIG. 5 and FIG. 6). If an epitaxial growth method is performed on basis of such a crystal grain (see FIG. 13), the crystal grains formed by the epitaxial growth method are also small, and, a resistance between the first semiconductor layer 102 and the wiring portion WP tend to be large. Here, in this embodiment, crystal structure of the amorphous silicon layer 131A is modified by the MILC method. According to such a method, it is possible to make the first crystal grains G1 in the second semiconductor layer 131 larger than the width in the Y direction of the openings op1 (substantially the same as W2 in FIG. 5 and FIG. 6). Moreover, by performing an epitaxial growth on the basis of such first crystal grains G1 (see FIG. 13), it is possible to form the second crystal grains G2 having large sizes in the second portions 109. Thereby, the resistance between the first semiconductor layers 102 and the wiring portion WP can be decreased. Note that in a case in which the second portions 109 of the first semiconductor layers 102 are formed by such a method, the second crystal grains G2 tend to be larger than the thickness T2 in the Y direction of the first portions 108. Moreover, the crystal orientations of the second crystal grains G2 are substantially equal to the crystal orientations of the first crystal grains G1.

Second Embodiment

[Configuration]

Next, with reference to FIG. 20, a configuration of a semiconductor memory device according to a second embodiment will be described. Note that, in FIG. 20, part of configuration is omitted for convenience of the explanation. Moreover, in descriptions later, same reference symbols are given to the same elements as the first embodiment, and, explanation is omitted.

Figure 20:
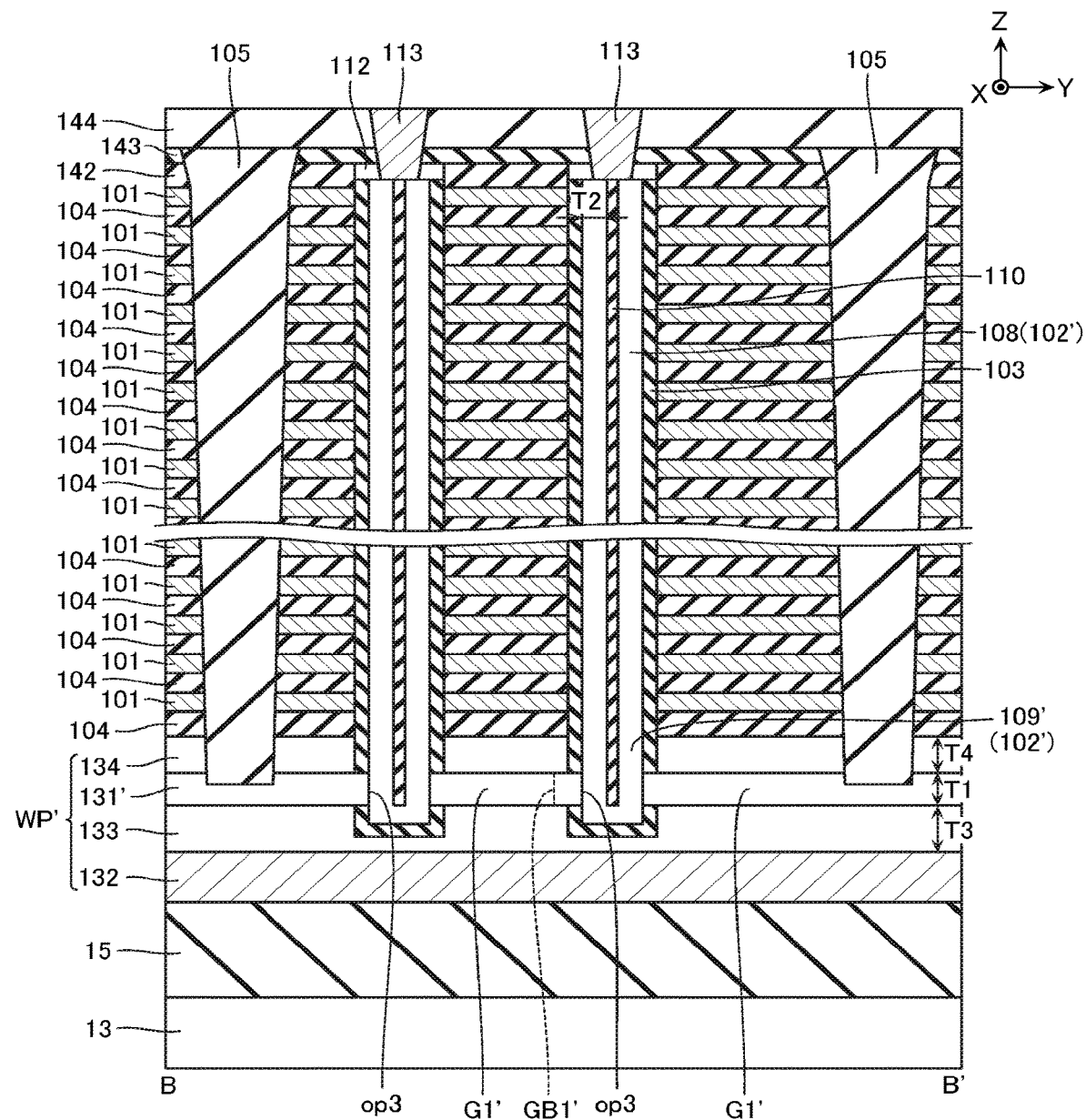
FIG. 20 is a schematic cross-sectional view of a semiconductor memory device according to a second embodiment.

Although the semiconductor memory device according to the second embodiment is basically the same as the semiconductor memory device according to the first embodiment, as shown in FIG. 20, configurations of a first semiconductor layer 102' and a wiring portion WP' differ from the first embodiment.

Although the first semiconductor layer 102' is configured basically the same as the first semiconductor layer 102 according to the first embodiment, a second portion 109' includes the same structure as the first portion 108. That is, the second portion 109' is a substantially cylindrical semiconductor layer extending in the Z direction. The second portion 109' includes a non-doped polycrystalline silicon (p-Si), or the like similarly to the first portion 108. Moreover, the insulating layer 110 such as silicon oxide ($SiO_2$) is embedded at a center of the second portion 109'.

The wiring portion WP' includes a second semiconductor layer 131' connected to the second portions 109' of the first semiconductor layers 102', and, a metal layer 132 provided between the second semiconductor layer 131' and the substrate 13. Moreover, the wiring portion WP' includes a third semiconductor layer 133 provided between the second semiconductor layer 131' and the metal layer 132, and, a fourth semiconductor layer 134 provided between the second semiconductor layer 131' and the plurality of conductive layers 101. The third semiconductor layer 133 and the fourth semiconductor layer 134 include polycrystalline silicon (p-Si) or the like into which impurities of n type such as phosphorus (P) are doped, for example.

Figure 21:
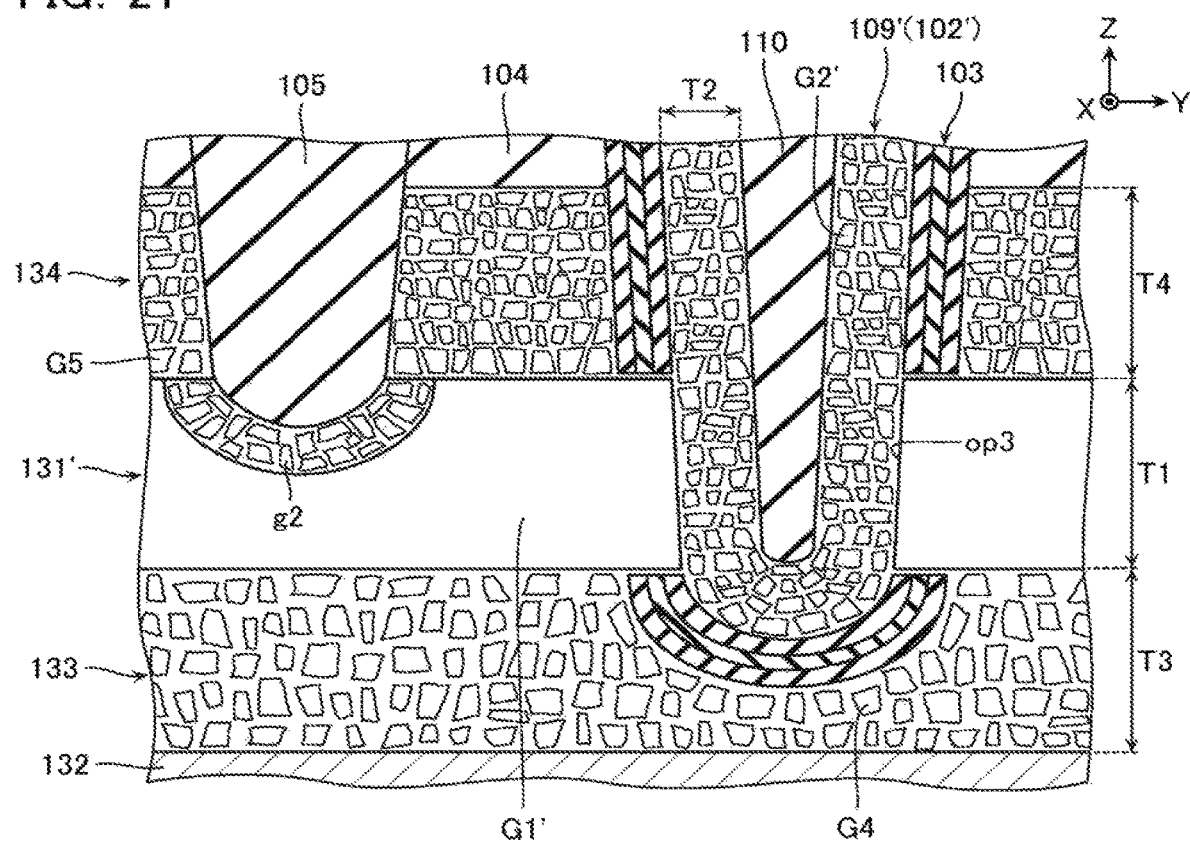
FIG. 21 is an enlarged view of a part of FIG. 20.

Next, with reference to FIG. 20 and FIG. 21, crystal structures of the first semiconductor layers 102', the second semiconductor layer 131', the third semiconductor layer 133 and the fourth semiconductor layer 134, or the like are described. FIG. 21 is an enlarged view of a part of FIG. 20. Note that, in FIG. 21, part of configuration is omitted for convenience of explanation.

The second semiconductor layer 131' includes a plurality of first crystal grains G1' as shown in FIG. 20. The first crystal grains G1' are provided corresponding to the insulating layers 105 on both side surfaces of memory fingers MF (first and second insulating layers extending in the Z direction, connected to the second semiconductor layer 131', and, including portions facing the plurality of conductive layers 101). Grain boundaries GB1' between the first crystal grains G1' (a fifth crystal grain and a sixth crystal grain) are positioned between the corresponding insulating layers 105 in the Y direction (positioned in vicinity of the center in the Y direction of the memory finger MF, for example). Widths in the Y direction of the first crystal grains G1' are substantially the same or a half as a width in the Y direction of the memory finger MF, and, is larger than the thickness T1 in the Z direction of the second semiconductor layer 131'. Crystal orientations of two of the first crystal grains G1' adjacent in the Y direction may differ from each other. Moreover, the first crystal grains G1' include through holes op3, and, the inner circumference surfaces of the through holes op3 are connected to the first semiconductor layers 102'. Moreover, although illustration is omitted, each of the plurality of first crystal grains G1' is extending in the X direction, and, is connected to a plurality of first semiconductor layers 102'. Moreover, as shown in FIG. 21, the second semiconductor layer 131' includes crystal grains g2 at a contact portion with the insulating layer 105. The crystal grains g2 are smaller than the thickness T1 in the Z direction of the second semiconductor layer 131'. Moreover, the second semiconductor layer 131' may include metal atoms of at least one of nickel (Ni), cobalt (Co), aluminum (Al) and palladium (Pd).

Note that the second portion 109' of the first semiconductor layer 102' includes second crystal grains G2'. The second crystal grains G2' are smaller than the thickness T2 in the Y direction of the first portion 108 of the first semiconductor layer 102'. Moreover, the third semiconductor layer 133 includes crystal grains G4 smaller than the thickness T3 in the Z direction of the third semiconductor layer 133. Moreover, the fourth semiconductor layer 134 includes crystal grains G5 smaller than the thickness T4 in the Z direction of the fourth semiconductor layer 134. In this embodiment, average sizes of the crystal grains in the first semiconductor layer 102', the third semiconductor layer 133 and the fourth semiconductor layer 134 are smaller than an average size of the crystal grain in the second semiconductor layer 131'. Moreover, in this embodiment, the largest crystal grain in the first semiconductor layer 102', the third semiconductor layer 133 and the fourth semiconductor layer 134 is smaller than the first crystal grain G1'.

[Manufacturing Method]

Next, a manufacturing method of the semiconductor memory device according to the second embodiment is described. Note that, in descriptions later, same reference numerals are given to the same elements as the first embodiment, and, explanation is omitted.

Figure 22:
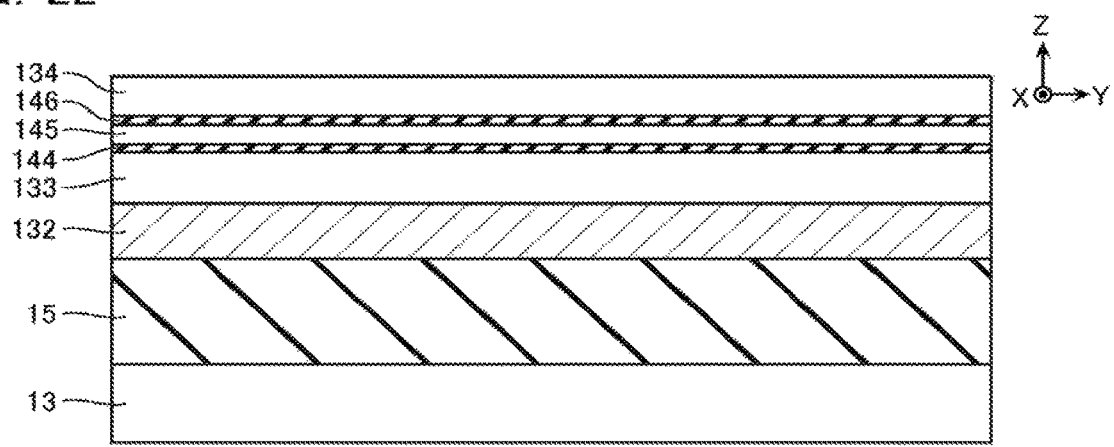
FIG. 22 is a schematic cross-sectional view showing the manufacturing method of the semiconductor memory device.

As shown in FIG. 22, in the manufacturing method, the insulating layer 15, the metal layer 132, the third semiconductor layer 133, an insulating film 144, a sacrifice layer 145, an insulating film 146 and the fourth semiconductor layer 134 are formed on the substrate 13. In this process, for example, the insulating layer 15, the metal layer 132, an amorphous silicon layer corresponding to the third semiconductor layer 133, the insulating film 144, an amorphous silicon layer corresponding to the sacrifice layer 145, the insulating film 146, and, an amorphous silicon layer corresponding to the fourth semiconductor layer 134 are formed on the substrate 13 by methods such as CVD. Next, crystal structures of the amorphous silicon layers are modified by methods such as annealing, and, the third semiconductor layer 133, the sacrifice layer 145, and, the fourth semiconductor layer 134 including polycrystalline silicon or the like are formed.

Figure 23:
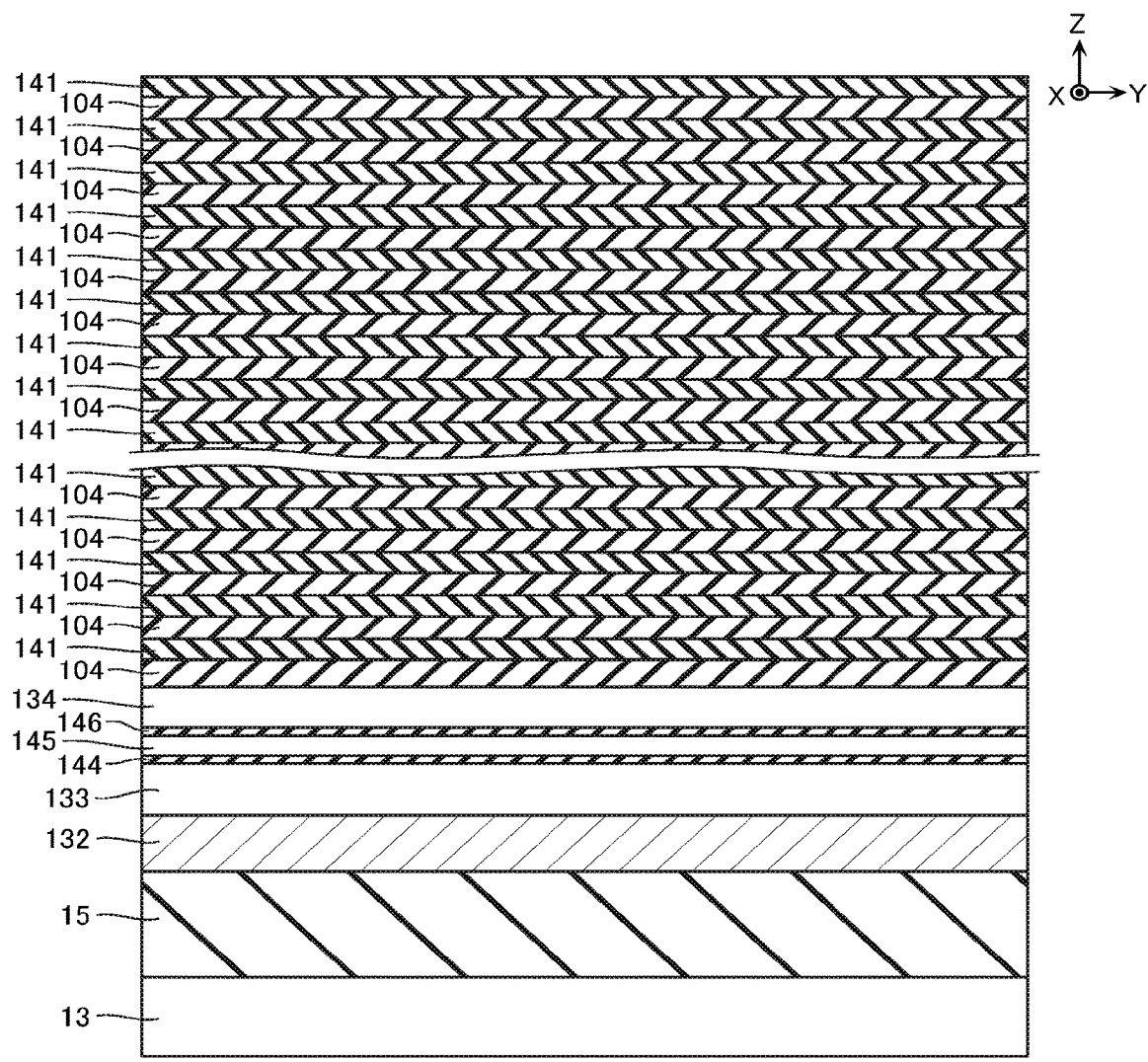
FIG. 23 is a schematic cross-sectional view showing the manufacturing method.

Next, as shown in FIG. 23, a plurality of insulating layers 104 and sacrifice layers 141 are alternately laminated on an upper surface of the fourth semiconductor layer 134. This process is performed similarly to the process described with reference to FIG. 11, for example.

Figure 24:
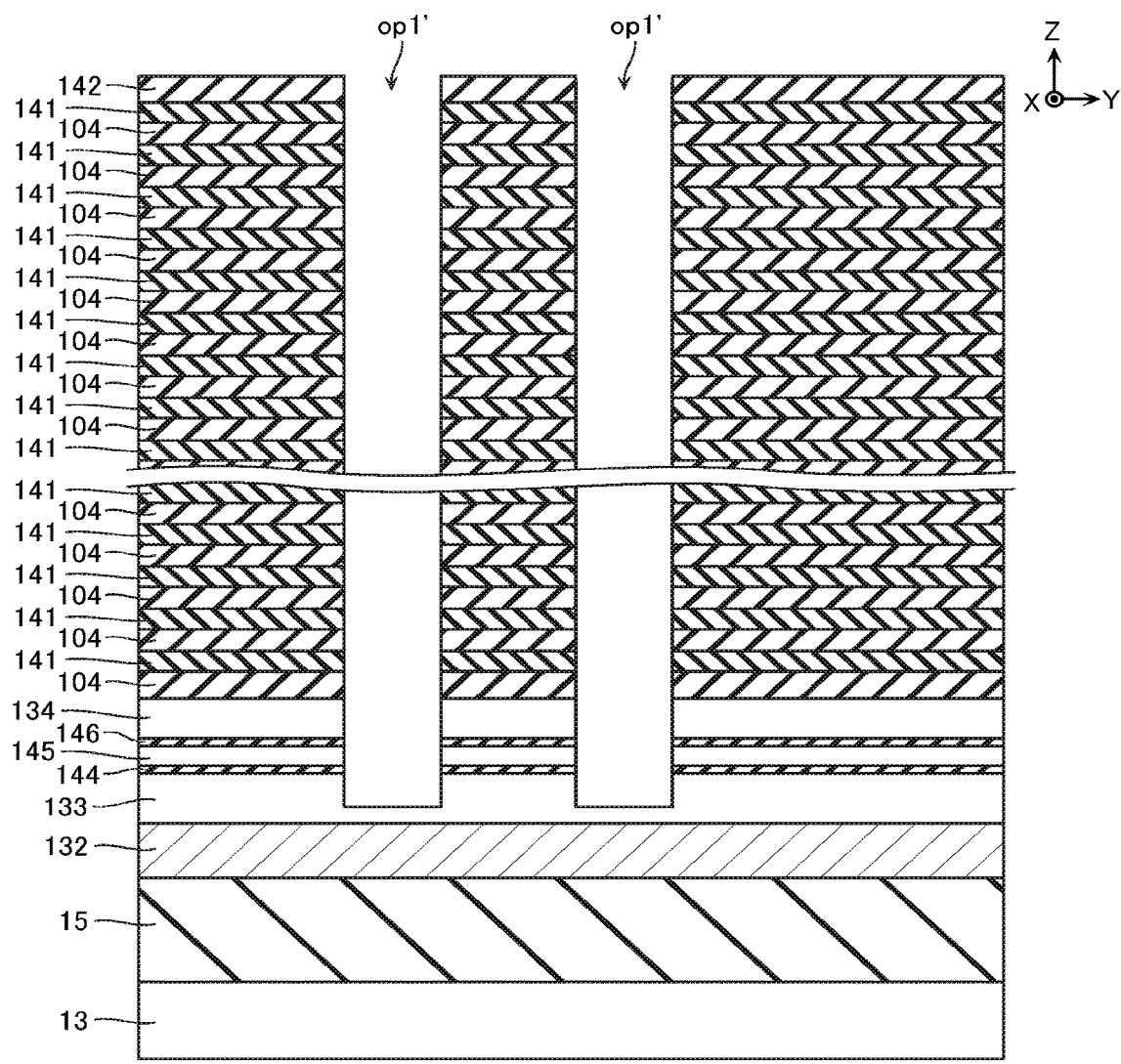
FIG. 24 is a schematic cross-sectional view showing the manufacturing method.

Next, as shown in FIG. 24, the openings op1' are formed in the insulating layers 104 and the sacrifice layers 141. The openings op1' are through holes extending in the Z direction, penetrating the insulating layers 104, the sacrifice layers 141, the fourth semiconductor layer 134, the insulating film 146, the sacrifice layer 145 and the insulating film 144, and, exposing the upper surface of the third semiconductor layer 133. This process is performed similarly to the process described with reference to FIG. 12, for example.

Figure 25:
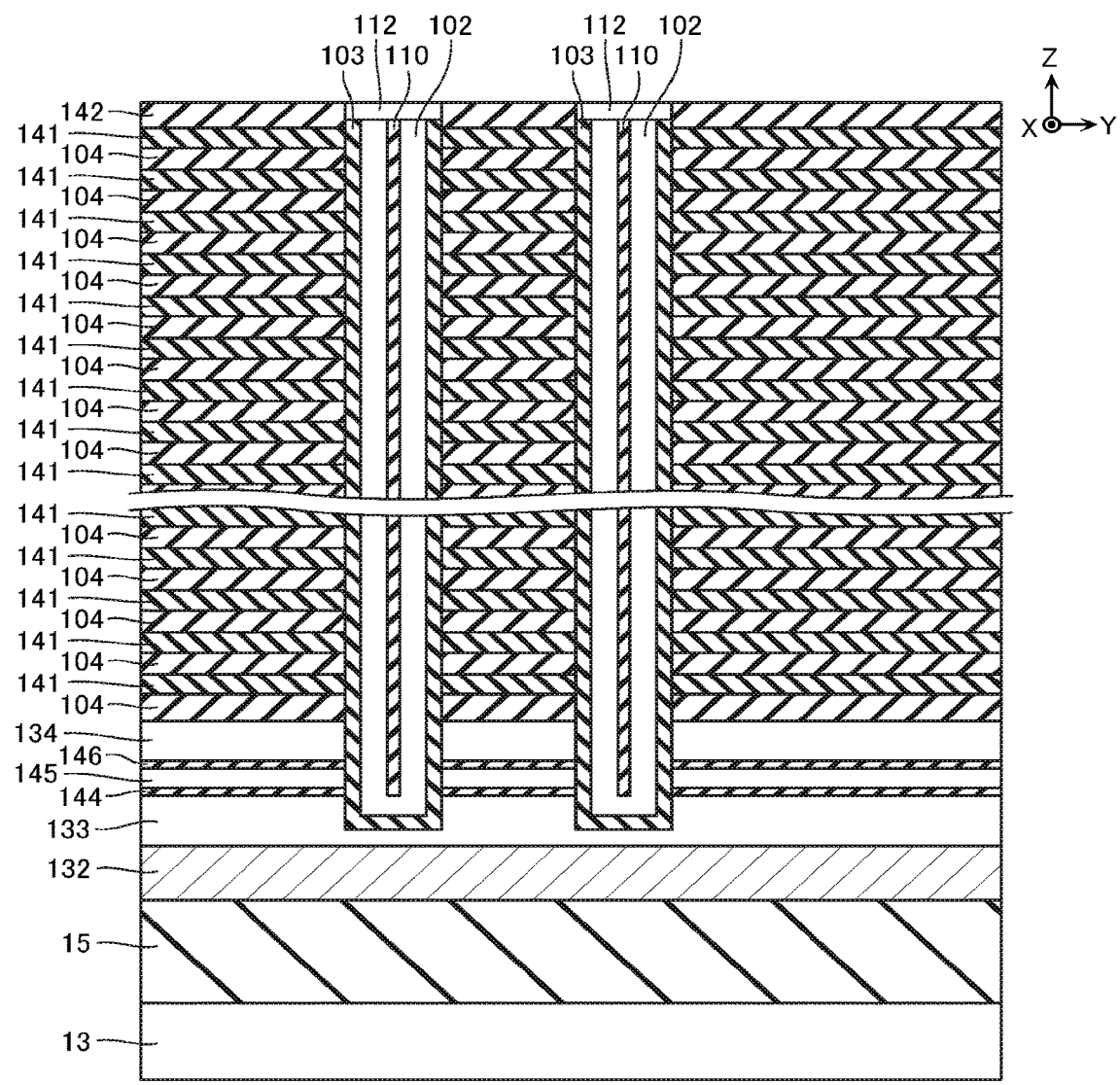
FIG. 25 is a schematic cross-sectional view showing the manufacturing method.

Next, as shown in FIG. 25, the gate insulating film 103, the first semiconductor layer 102, the insulating layer 110 and the semiconductor layer 112 are formed. This process is performed similarly to the processes described with reference to FIG. 14, FIG. 16, FIG. 17 and FIG. 18, for example. However, in the process described with reference to FIG. 16, it is not necessary to form the amorphous silicon layer 108B.

Figure 26:
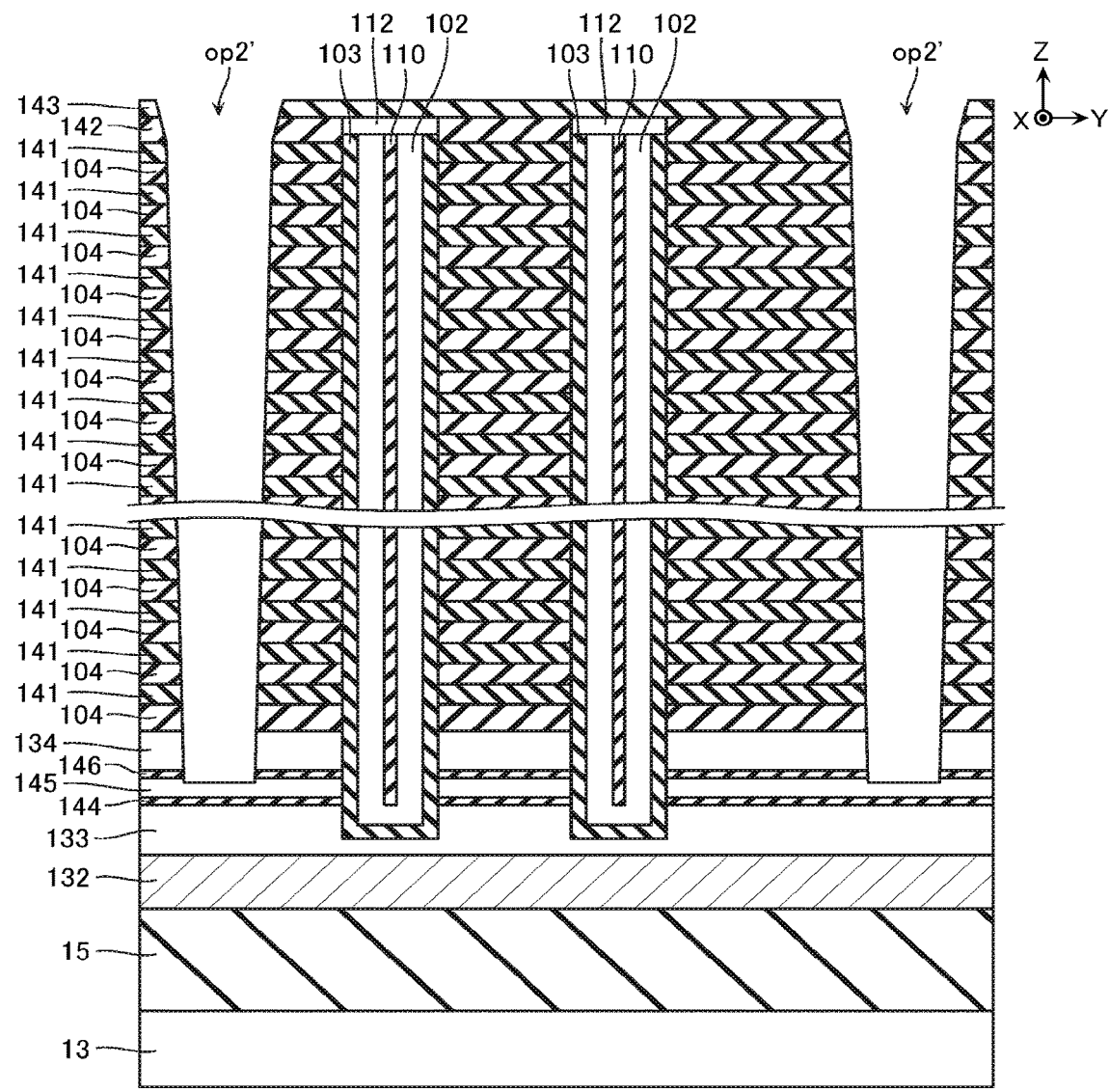
FIG. 26 is a schematic cross-sectional view showing the manufacturing method.

Next, as shown in FIG. 26, openings op2' are formed in the insulating layers 104 and the sacrifice layers 141. The openings op2' are slits extending in the Z direction and the X direction, dividing the insulating layers 104, the sacrifice layers 141, the fourth semiconductor layer 134 and the insulating film 146 in the Y direction, and, exposing the upper surface of the sacrifice layer 145. This process is performed similarly to the process described with reference to FIG. 19, for example.

Figure 27:
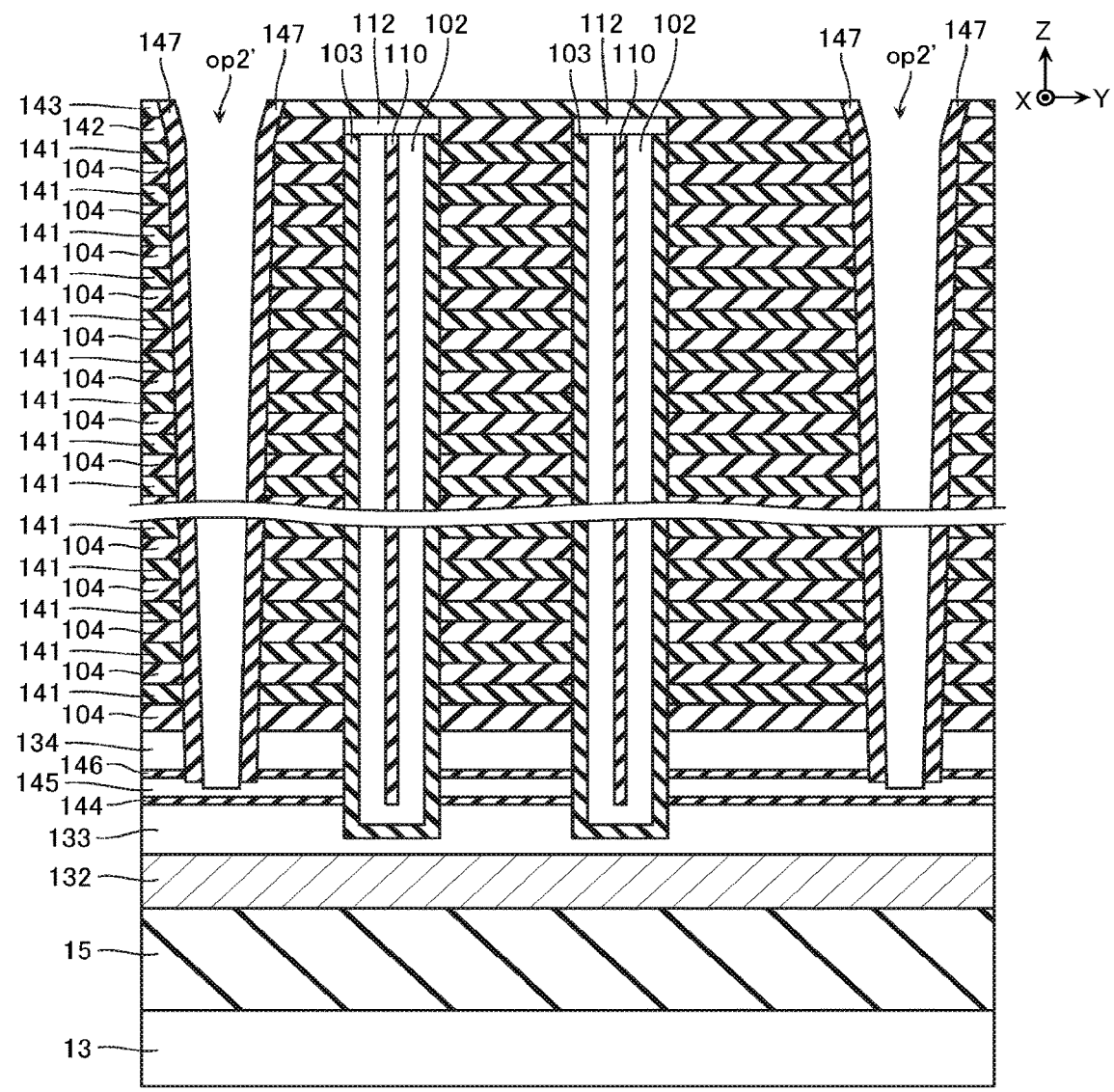
FIG. 27 is a schematic cross-sectional view showing the manufacturing method.

Next, as shown in FIG. 27, insulating films 147 are formed on side surfaces in the Y direction of the openings op2'. In this process, the insulating films 147 including $SiO_2$ or the like is formed on the side surfaces and the bottom surface of the openings op2' by methods such as CVD, for example. Next, portions of the insulating film 147 on the bottoms of the openings op2' are removed by a method such as RIE, and, the upper surface of the sacrifice layer 145 is exposed.

Figure 28:
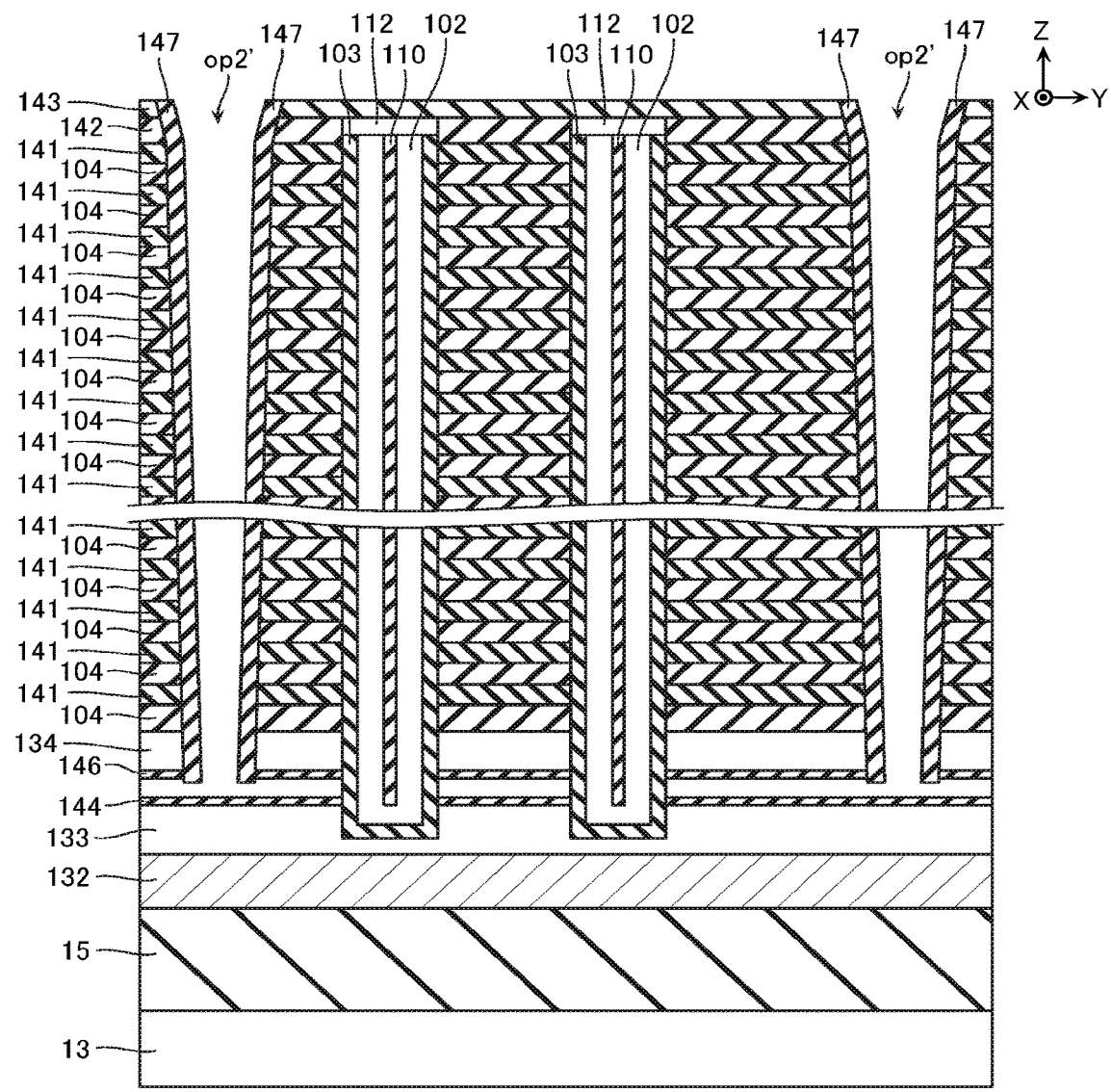
FIG. 28 is a schematic cross-sectional view showing the manufacturing method.

Next, as shown in FIG. 28, the sacrifice layer 145 is removed. This process is performed by using wet etching via the openings op2' or the like, for example.

Figure 29:
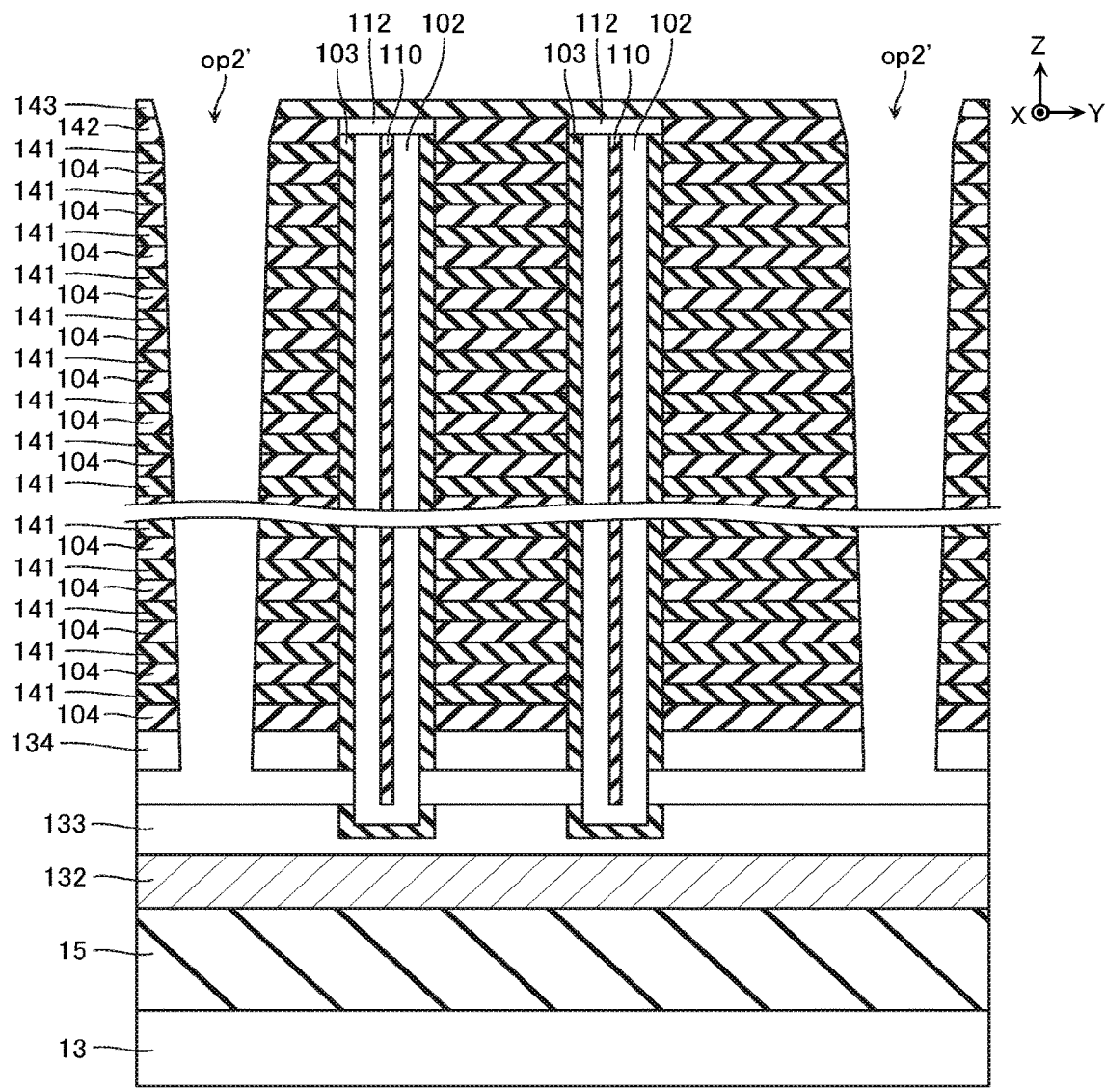
FIG. 29 is a schematic cross-sectional view showing the manufacturing method.

Next, as shown in FIG. 29, portions of the gate insulating films 103, the insulating film 144, the insulating film 146 and the insulating film 147 are removed. This process is performed by wet etching via the openings op2' or the like, for example.

Figure 30:
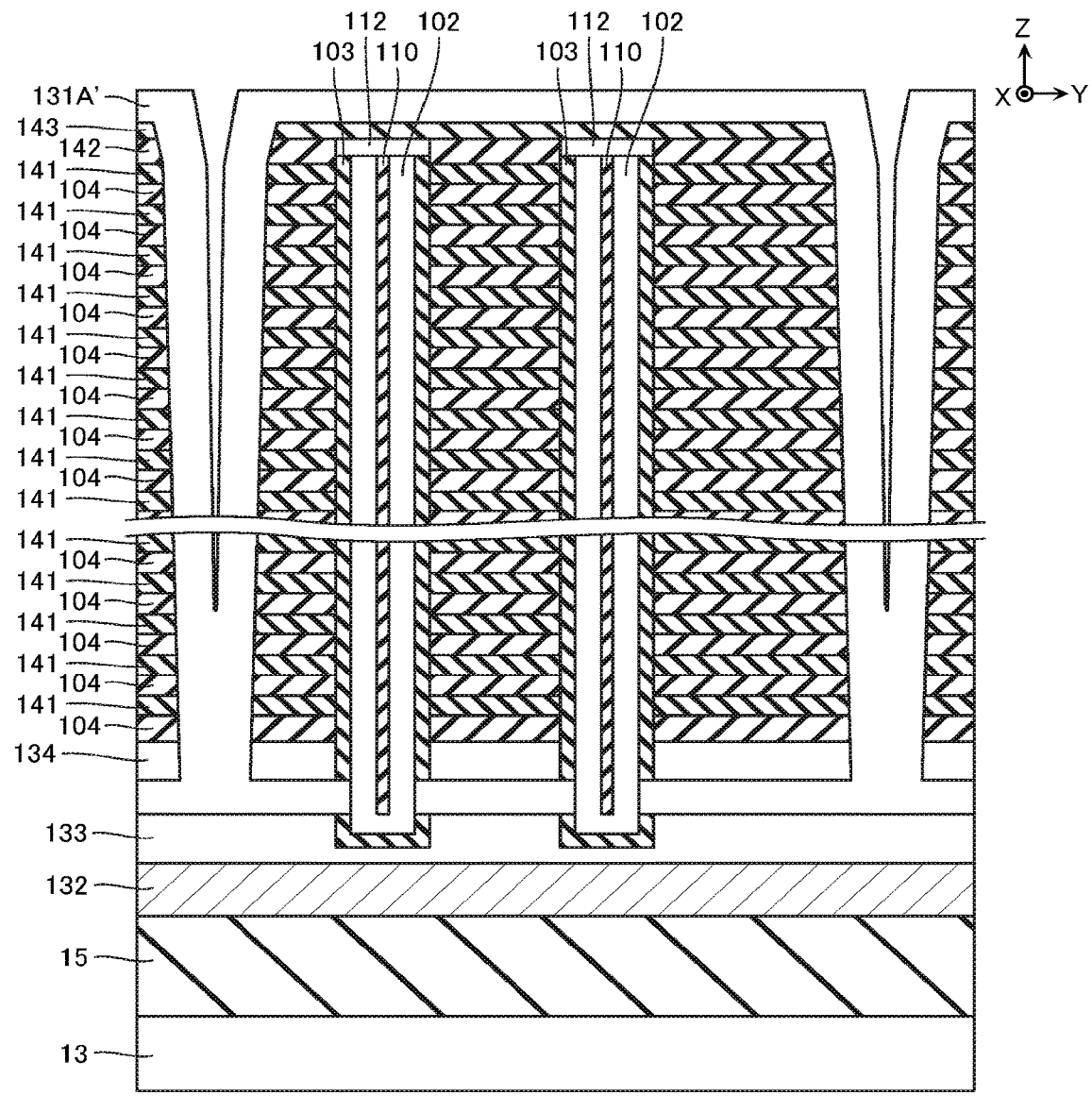
FIG. 30 is a schematic cross-sectional view showing the manufacturing method.

Next, as shown in FIG. 30, an amorphous silicon layer 131A' is formed on side surfaces in the X direction and the Y direction of the first semiconductor layers 102', on the upper surface of the third semiconductor layer 133, on the lower surface of the fourth semiconductor layer 134, on the side surfaces in the Y direction of the fourth semiconductor layer 134, the insulating layers 104, the sacrifice layers 141, the insulating layer 142 and the insulating layer 143, and, on the upper surface of the insulating layer 143. This process is performed by CVD or the like, for example.

Figure 31:
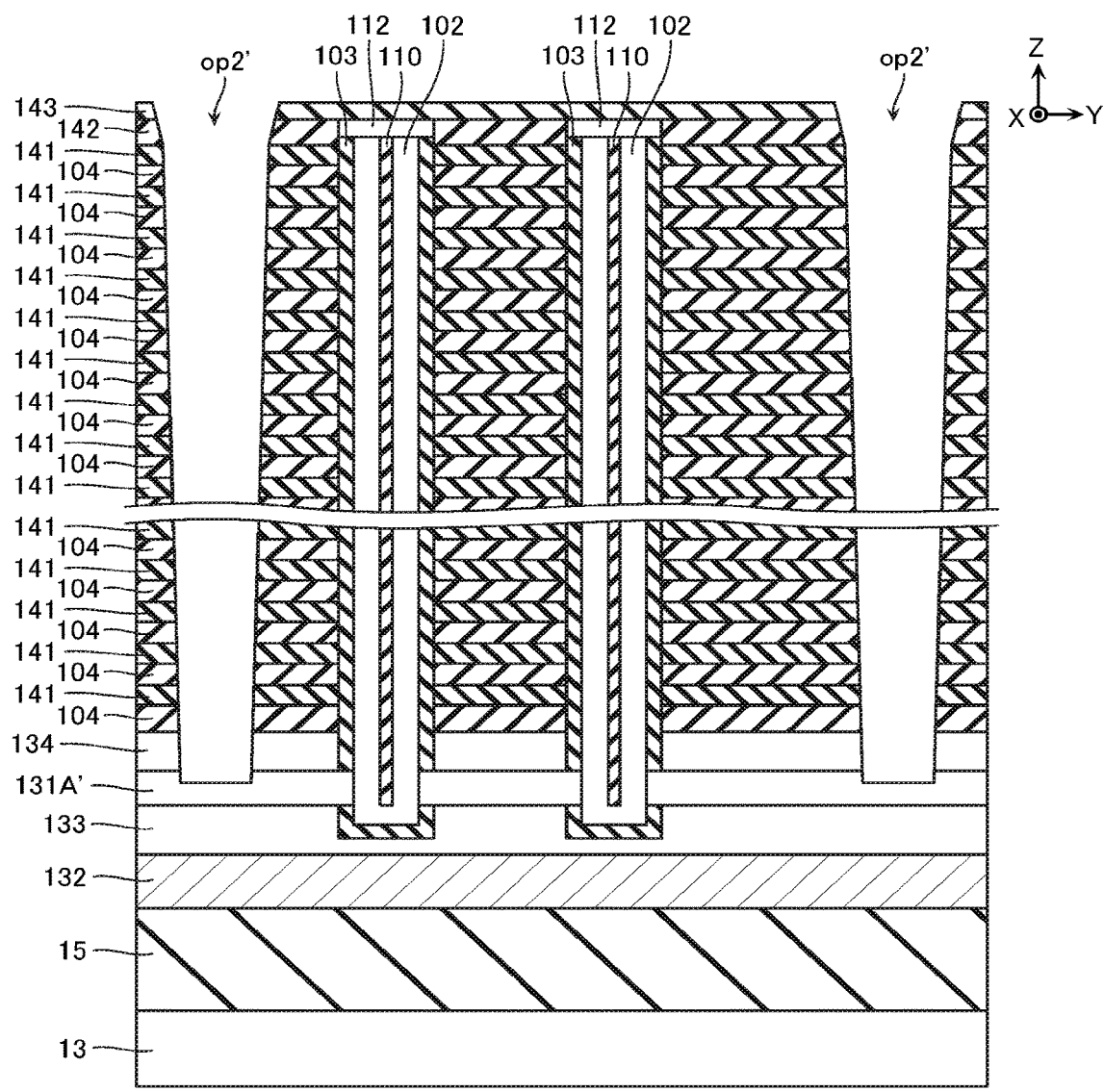
FIG. 31 is a schematic cross-sectional view showing the manufacturing method.

Next, as shown in FIG. 31, portions of the amorphous silicon layer 131A' provided on the side surfaces in the Y direction of the fourth semiconductor layer 134, the insulating layers 104, the sacrifice layers 141, the insulating layer 142 and the insulating layer 143, and, on the upper surface of the insulating layer 143 are removed. This process is performed by wet etching or the like, for example.

Figure 32:
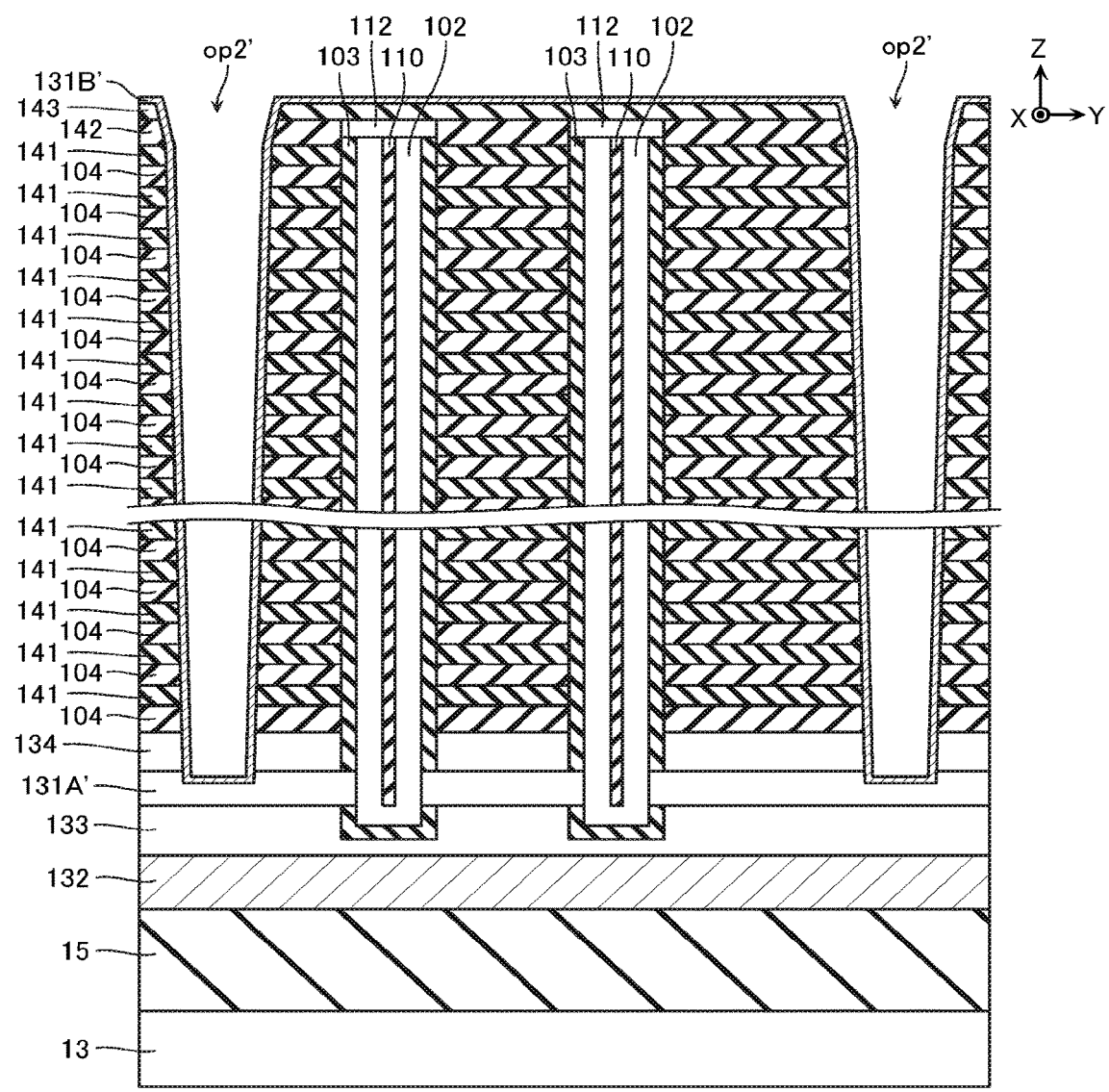
FIG. 32 is a schematic cross-sectional view showing the manufacturing method.

Next, as shown in FIG. 32, a metal layer 131B' is formed on the upper surface of the amorphous silicon layer 131A', on the side surfaces in the Y direction of the fourth semiconductor layer 134, the insulating layers 104, the sacrifice layers 141, the insulating layer 142 and the insulating layer 143, and, on the upper surface of the insulating layer 143. The formation of the metal layer 131B' is performed by depositing nickel (Ni) or the like by PVD (Physical Vapor Deposition) such as sputtering, for example. Note that the metal layer 131B' may include cobalt (Co), aluminum (Al) or palladium (Pd), for example.

Figure 33:
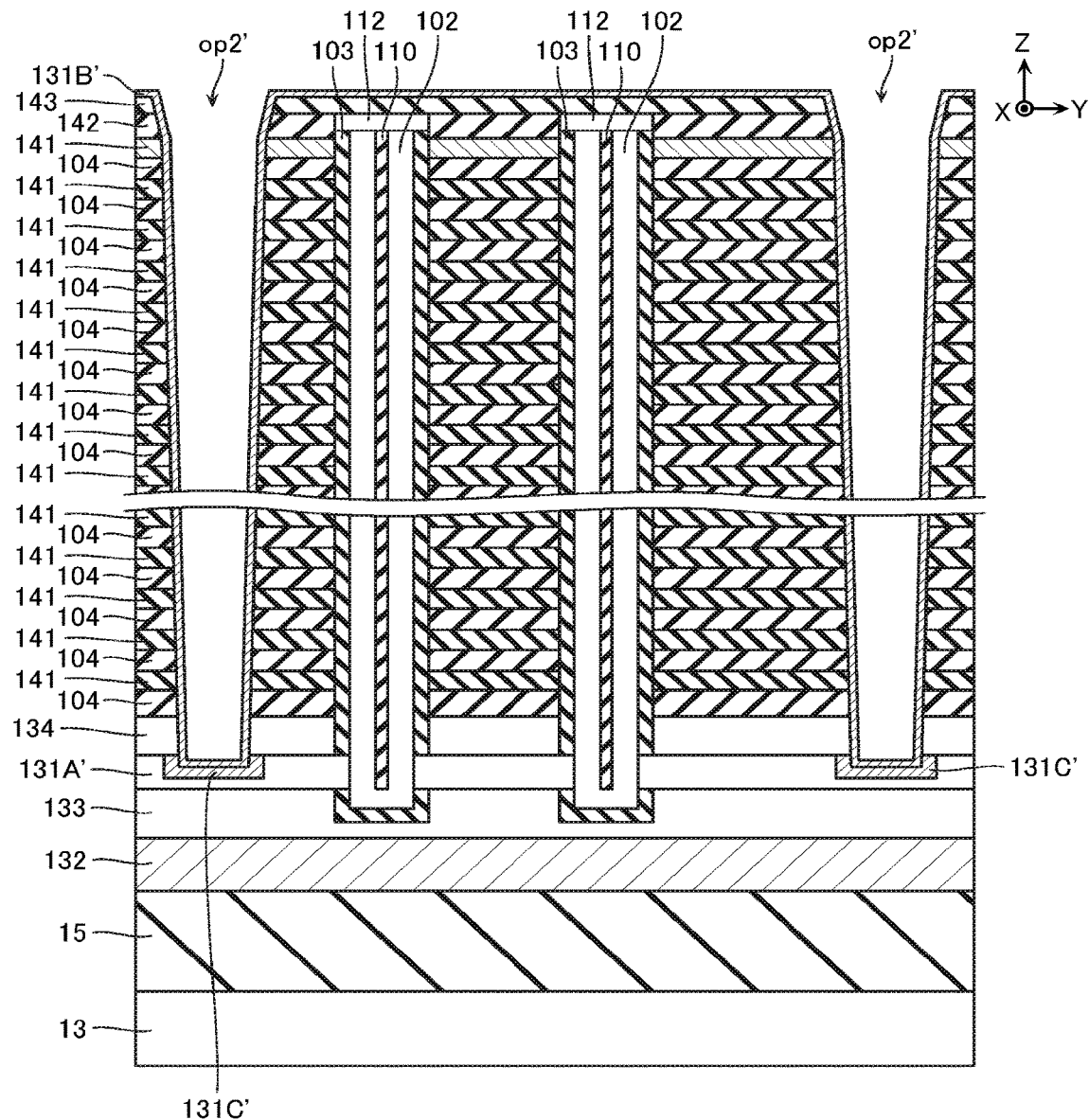
FIG. 33 is a schematic cross-sectional view showing the manufacturing method.

Next, as shown in FIG. 33, silicide layers 131C' are formed in the upper surface of the amorphous silicon layer 131A'. The silicide layer 131C' is formed by a heat treatment or the like, for example. If the heat treatment or the like is performed, metal atoms in the metal layer 131B' diffuses into the amorphous silicon layer 131A' to form metal silicide. The silicide layer 131C' includes nickel disilicide ($NiSi_2$), for example. After the formation of the silicide layer 131C', the metal layer 131B' is removed by wet etching, dry etching, or other means.

Figure 34:
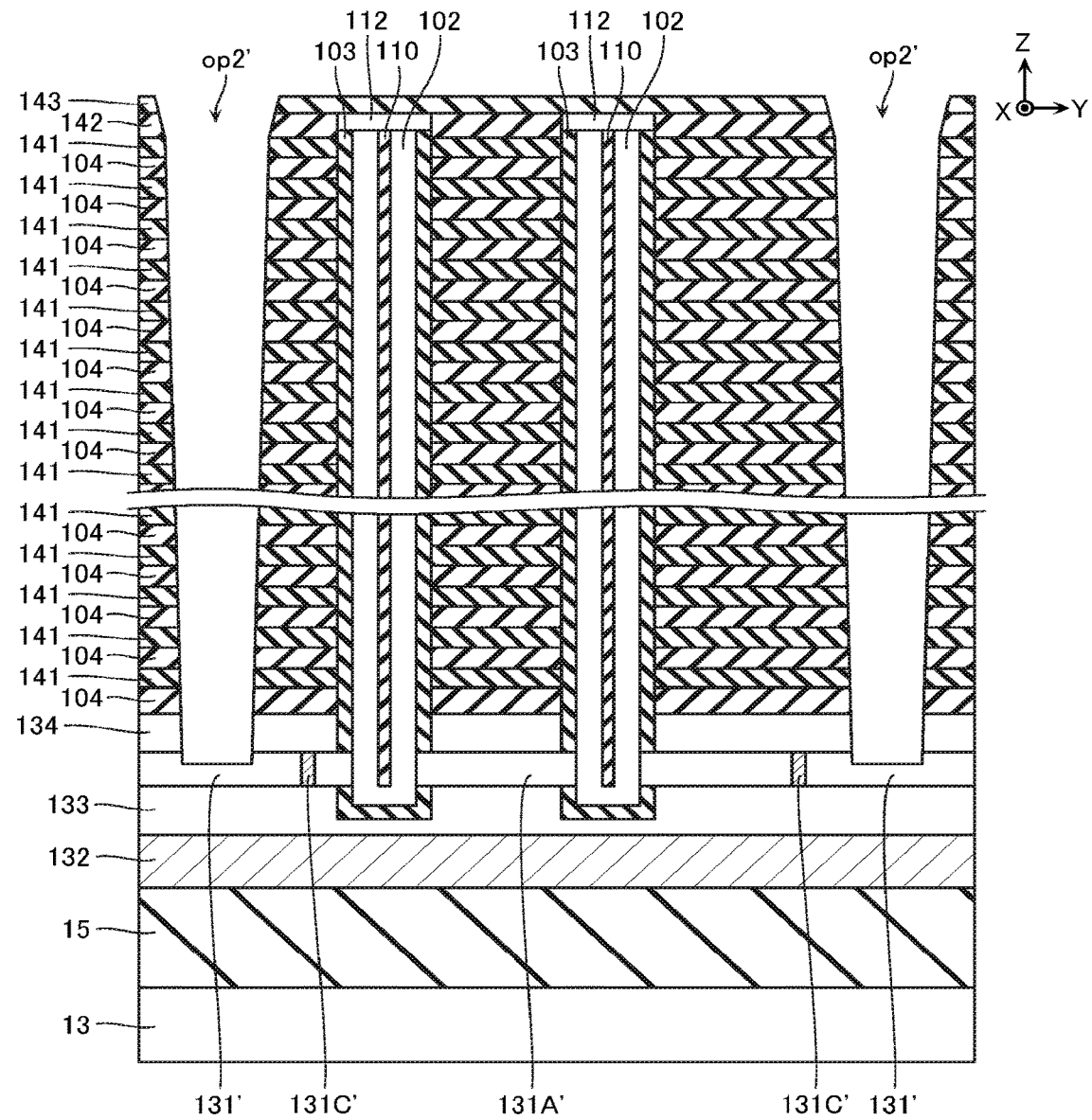
FIG. 34 is a schematic cross-sectional view showing the manufacturing method.
Figure 35:
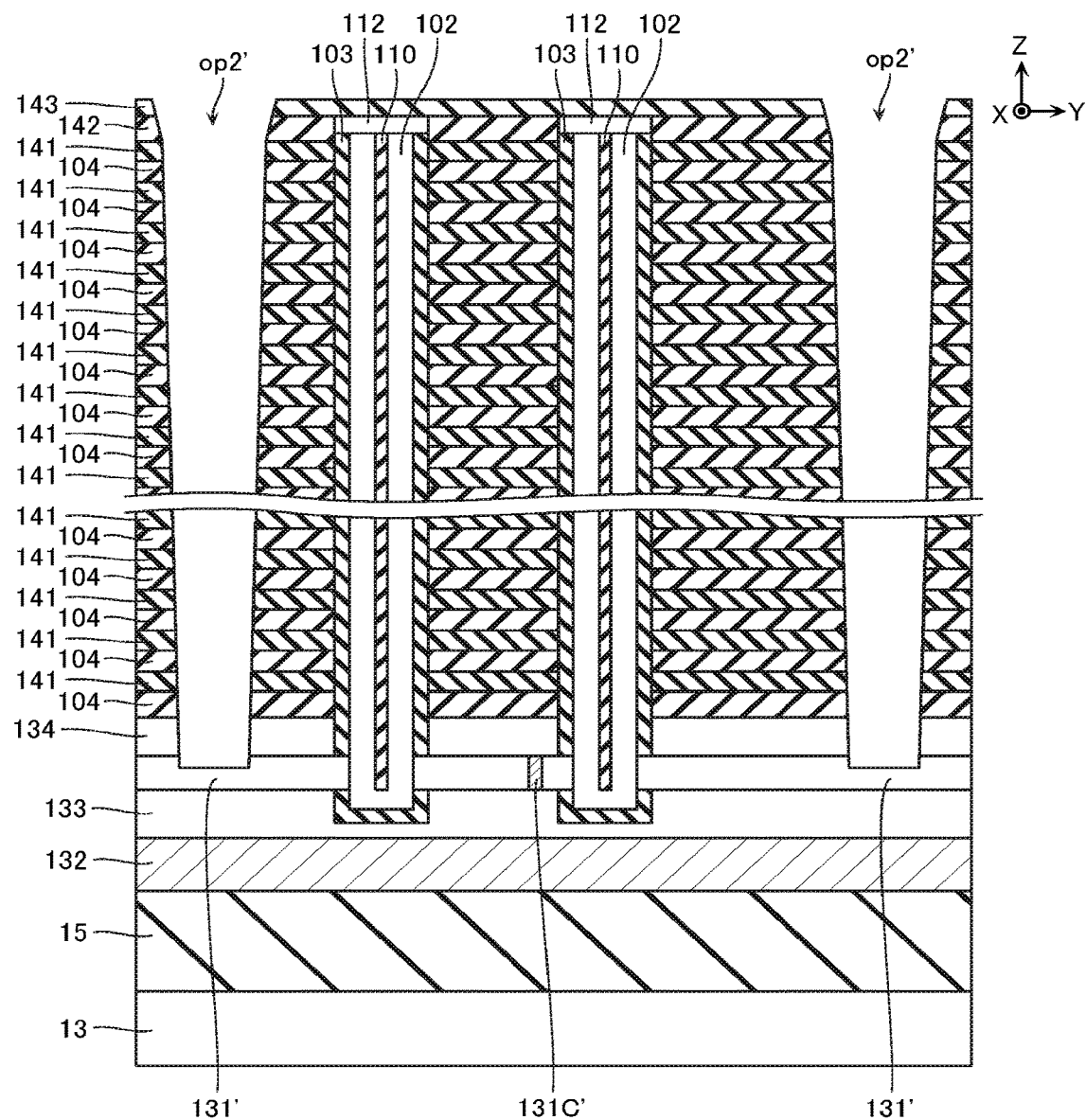
FIG. 35 is a schematic cross-sectional view showing the manufacturing method.

Next, as shown in FIG. 34 and FIG. 35, crystal structure of amorphous silicon layer 131A' is modified to form the second semiconductor layer 131'. The modification of crystal structure is performed by the MILC method described above. In this process, as shown in FIG. 34, the silicide layer 131C' proceeds in the Y direction from the openings op2'. The silicide layer 131C' passes through the amorphous silicon layer 131A', and, the second semiconductor layer 131' is formed in portions through which the silicide layer 131C' passed. Moreover, as shown in FIG. 35, two silicide layers 131C' which has proceeded in the Y direction contact at a portion in vicinity of the center in the Y direction of the memory finger MF. The grain boundary GB1' described above is formed in such a portion.

Then, the sacrifice layers 141 are removed by wet etching or the like via the openings op2', the conductive layers 101 are formed between the insulating layers 104 adjacent in the Z direction, the insulating layers 105 are formed in the openings op2', and, contacts, wirings and the like are formed, thereby manufacturing the semiconductor memory device according to this embodiment.

[Advantages]

In this embodiment, the second semiconductor layer 131' includes the first crystal grains G1' larger than the thickness T1 in the Z direction of the second semiconductor layer 131' similarly to the first embodiment. That makes it possible to provide a semiconductor memory device including the wiring portion WP having a low resistance.

Moreover, in this embodiment, as described above, the sacrifice layers 141 are removed before forming the conductive layer 101. By removing the sacrifice layers 141, a hollow structure is formed. The hollow structure includes the plurality of insulating layers 104 arranged in the Z direction via voids, and, the first semiconductor layers 102 supporting the plurality of insulating layers 104. Here, such a hollow structure may collapse according to the height, an aspect ratio, or the like of the hollow structure. Moreover, along with high integration of a semiconductor memory device, the height, an aspect ratio and the like of such a hollow structure tend to increase, and, thus a collapse of such a hollow structure is desired to be prevented. Here, in this embodiment, the third semiconductor layer 133 and the fourth semiconductor layer 134 are provided under the sacrifice layers 141 and the insulating layers 104 (see FIG. 22). Additionally, the openings op1' penetrating apart of the third semiconductor layer 133 and the fourth semiconductor layer 134 are formed (see FIG. 24). Moreover, the first semiconductor layers 102 and the like is formed inside the openings op1'. Thereby, the lower ends of the first semiconductor layers 102 can be supported, and, collapse of the hollow structures described above can be suppressed.

In such a method, as described with reference to FIG. 20, the third semiconductor layer 133 including polycrystalline silicon or the like is provided between the second semiconductor layer 131' and the metal layer 132. Moreover, it is considered that resistance in the third semiconductor layer 133 is larger than resistance in the second semiconductor layer 131' and resistance of the metal layer 132. Here, in this embodiment, since the second semiconductor layer 131' includes the first crystal grains G1', resistance in the X direction and the Y direction of the second semiconductor layer 131' is relatively small. Therefore, areas of regions through which current flows in the third semiconductor layer 133 is relatively large. Thereby, an increase of the resistance by the third semiconductor layer 133 can be suppressed.

Third Embodiment

[Configuration]

Figure 36:
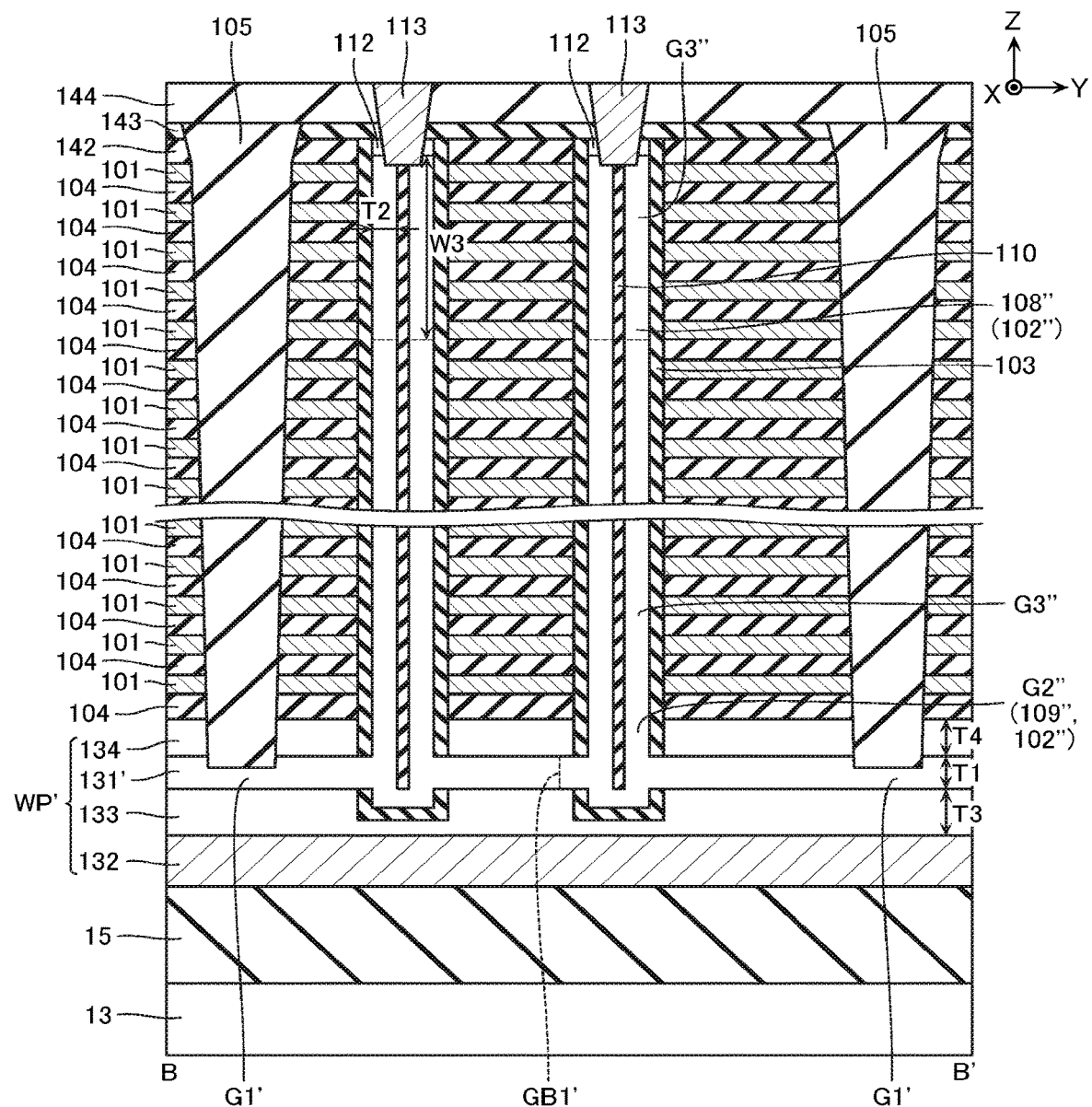
FIG. 36 is a schematic cross-sectional view of a semiconductor memory device according to a third embodiment.
Figure 37:
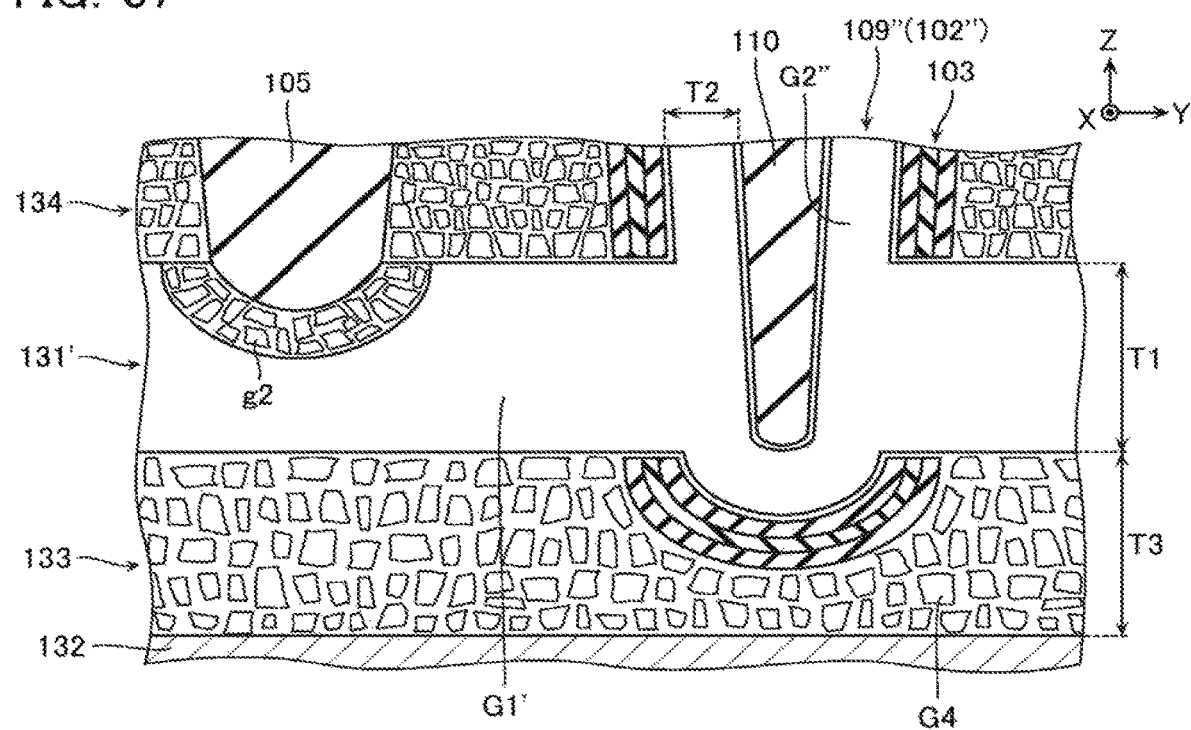
FIG. 37 is an enlarged view of a part of FIG. 36.

Next, with reference to FIG. 36 and FIG. 37, a configuration of a semiconductor memory device according to a third embodiment is described. In FIG. 36 and FIG. 37, part of configuration is omitted for convenience of explanation. Moreover, in descriptions later, same reference numerals are given to the same elements as the second embodiment, and, explanation is omitted.

Although the semiconductor memory device according to the third embodiment is basically the same as the semiconductor memory device according to the second embodiment, as shown in FIG. 36 and FIG. 37, crystal structures of a second portion 109" and a first portion 108" of a first semiconductor layer 102" differ from those in the second embodiment.

The second portion 109" includes second crystal grain G2" as shown in FIG. 36. The second crystal grain G2" has a substantially cylindrical shape extending in the Z direction. The second crystal grain G2' is larger than the thickness T2 in the Y direction of the first portion 108'. Please note that the second crystal grain G2' is larger than a thickness in the Y direction of the second portion 109". Moreover, the second crystal grain G2' is connected to the first crystal grain G1' on a side surface in the X direction and the Y direction. Moreover, crystal orientation of the second crystal grain G2" is substantially equal to the crystal orientation of the first crystal grain G1' to which the second crystal grain G2" is connected. Note that, in the illustrated example, the second crystal grain G2' and the first crystal grain G1' are portions of one crystal grain.

The first portion 108" includes a plurality of third crystal grains G3" arranged in the Z direction. The third crystal grains G3" have a substantially cylindrical shape extending in the Z direction. The third crystal grains G3" have a width W3 in the Z direction larger than the thickness T2 in the Y direction of the first portion 108". Moreover, crystal orientations of the third crystal grains G3" positioned within a certain range from the upper end of the semiconductor layer 102" are substantially equal. Furthermore, crystal orientations of the third crystal grains G3' positioned at lower positions than the certain range are substantially equal to the crystal orientation of the second crystal grains G2". Note that the crystal orientation of the third crystal grains G3' positioned in the upper portion and the crystal orientation of the third crystal grains G3" positioned in the lower position may be different. Hereinafter, the plurality of third crystal grains G3" positioned in the upper portion may be especially called "the fourth crystal grain". Note that, in the illustrated example, a lowermost third crystal grain G3' and the second crystal grain G2' are portions of one crystal grain.

Moreover, the first portion 108" may include metal atoms of at least one of nickel (Ni), cobalt (Co), aluminum (Al) and palladium (Pd). Such metal atoms may exist in vicinity of a lower end of the certain range in which the fourth crystal grain described above is positioned, for example.

[Manufacturing Method]

Next, a manufacturing method of the semiconductor memory device according to this embodiment will be described. Note that, in descriptions later, same reference numerals are given to the same elements as the second embodiment, and, explanation is omitted.

In the manufacturing method, the processes described with reference to FIG. 22-FIG. 29 are performed. However, in the process described with reference to FIG. 25, the annealing treatment for modification of crystal structure of the amorphous silicon layer 108A is not performed. Moreover, the semiconductor layer 112 is not formed.

Figure 38:
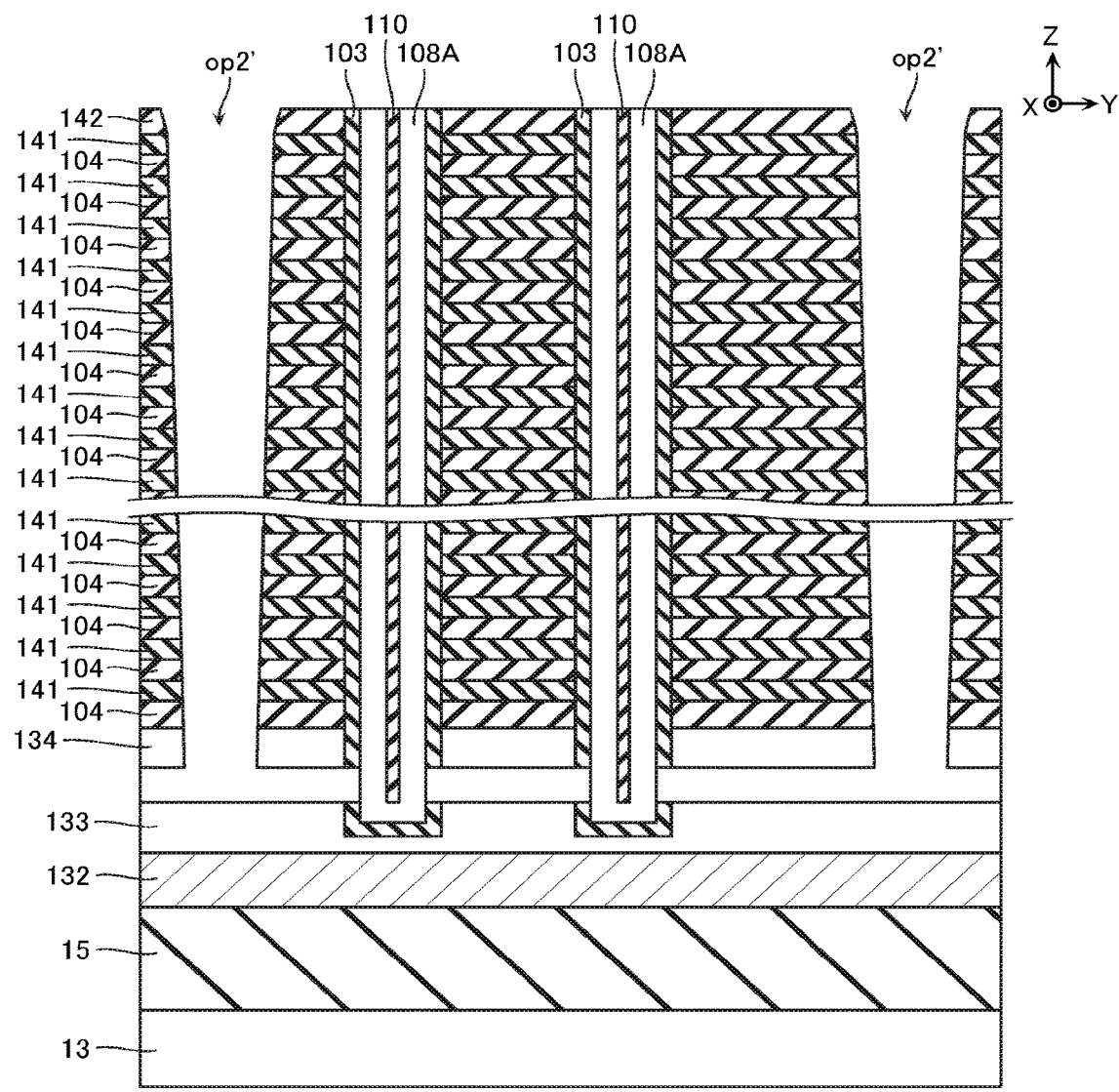
FIG. 38 is a schematic cross-sectional view showing the manufacturing method of the semiconductor memory device.

Next, as shown in FIG. 38, the insulating layer 143 is removed to expose the upper surface of the amorphous silicon layer 108A. In this process, a method such as RIE is performed, for example.

Next, the processes described with reference to FIG. 30 and FIG. 31 are performed.

Figure 39:
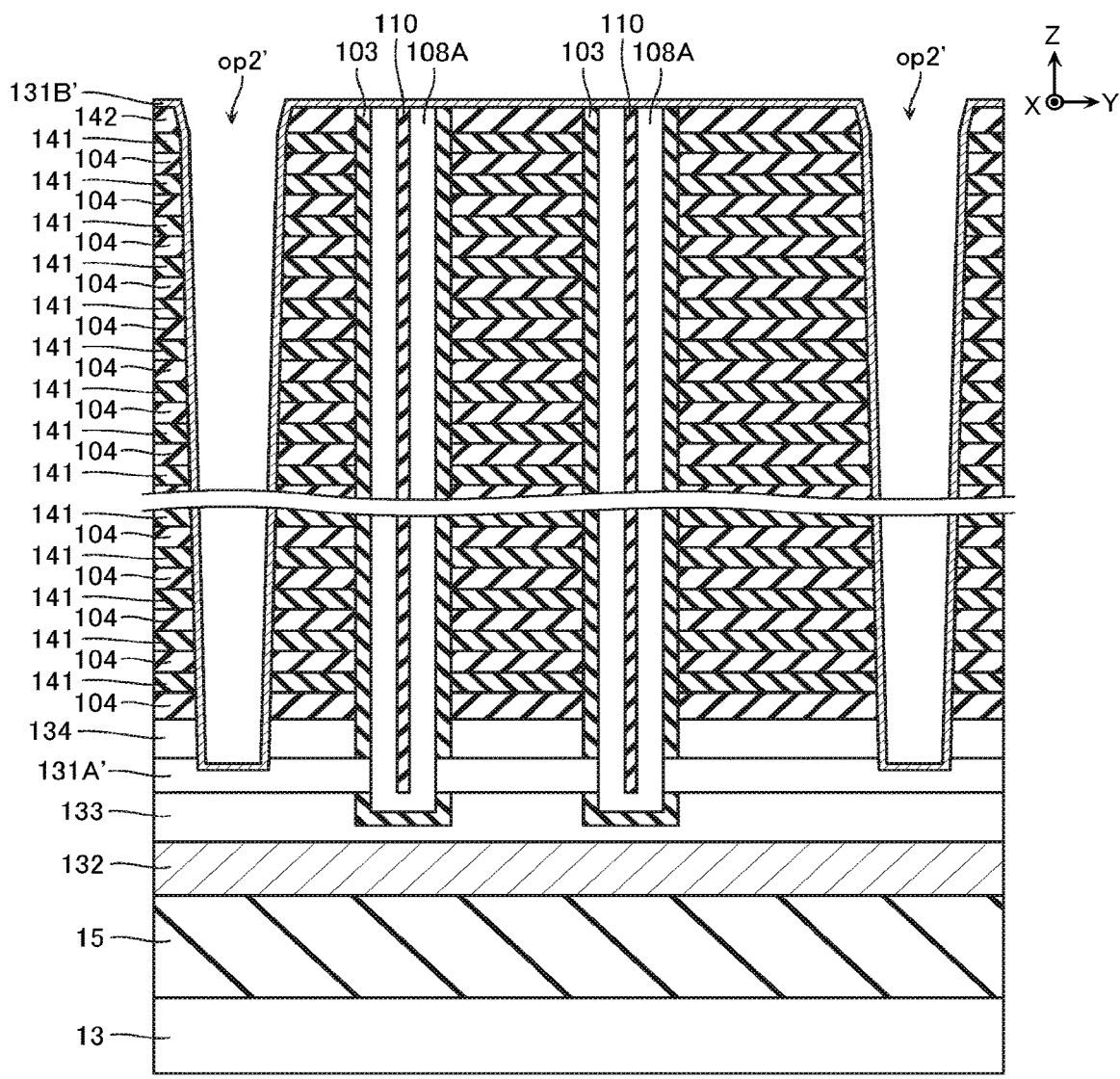
FIG. 39 is a schematic cross-sectional view showing the manufacturing method.

Next, as shown in FIG. 39, the metal layer 131B' is formed on the upper surface of the amorphous silicon layer 131A', on the side surfaces in the Y direction of the fourth semiconductor layer 134, the insulating layers 104, the sacrifice layers 141 and the insulating layer 142, and, the upper surfaces of the insulating layer 142 and the amorphous silicon layer 108A. This process is performed similarly to the process described with reference to FIG. 32, for example.

Figure 40:
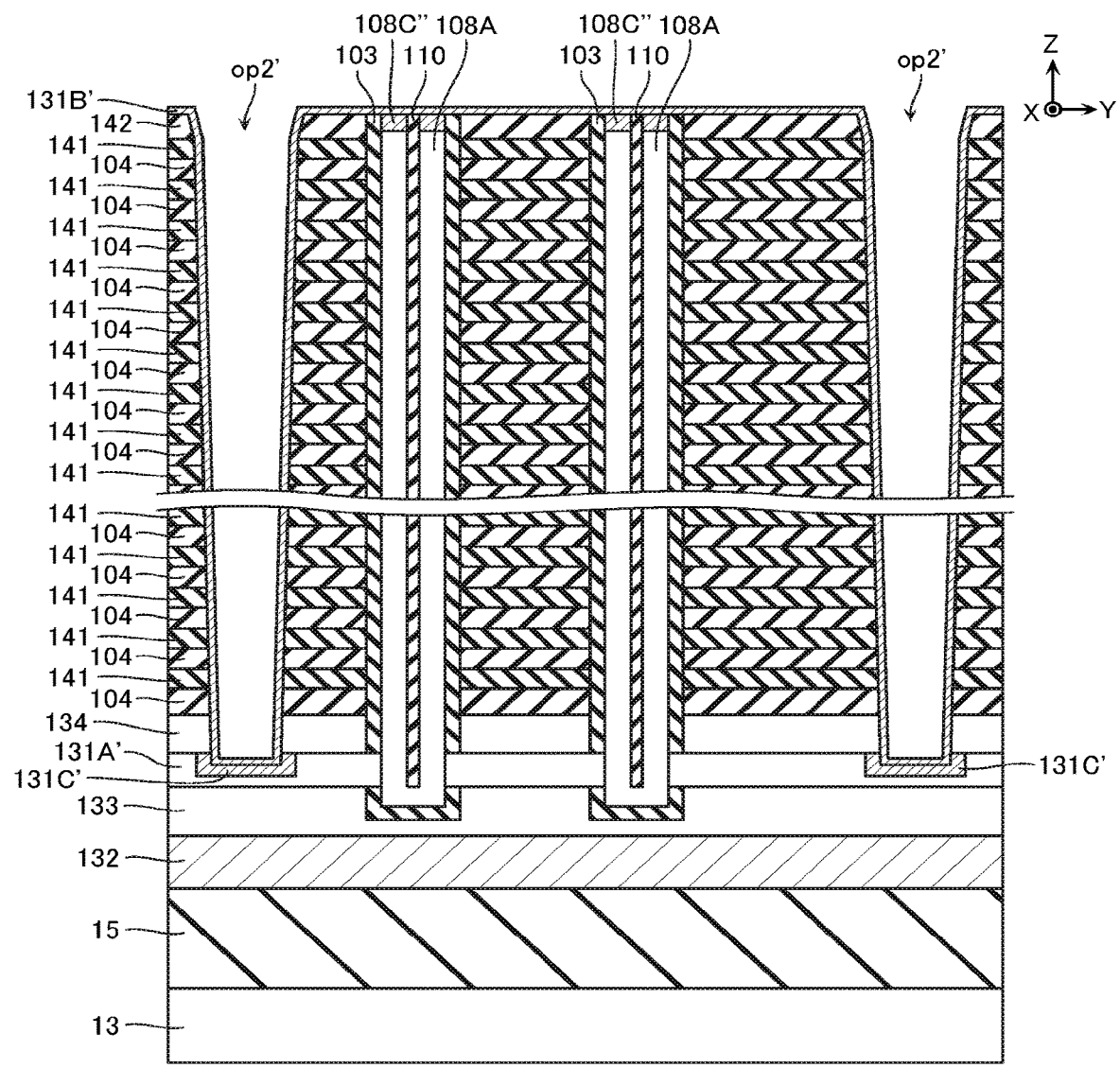
FIG. 40 is a schematic cross-sectional view showing the manufacturing method.

Next, as shown in FIG. 40, the silicide layer 131C' is formed in the upper surface of the amorphous silicon layer 131A', and, the silicide layer 108C" is formed on the upper surface of the amorphous silicon layer 108A. This process is performed similarly to the process described with reference to FIG. 33, for example. After the formation of the silicide layer 131C' and the silicide layer 108C', the metal layer 131B' is removed by wet etching, dry etching, or other means.

Figure 41:
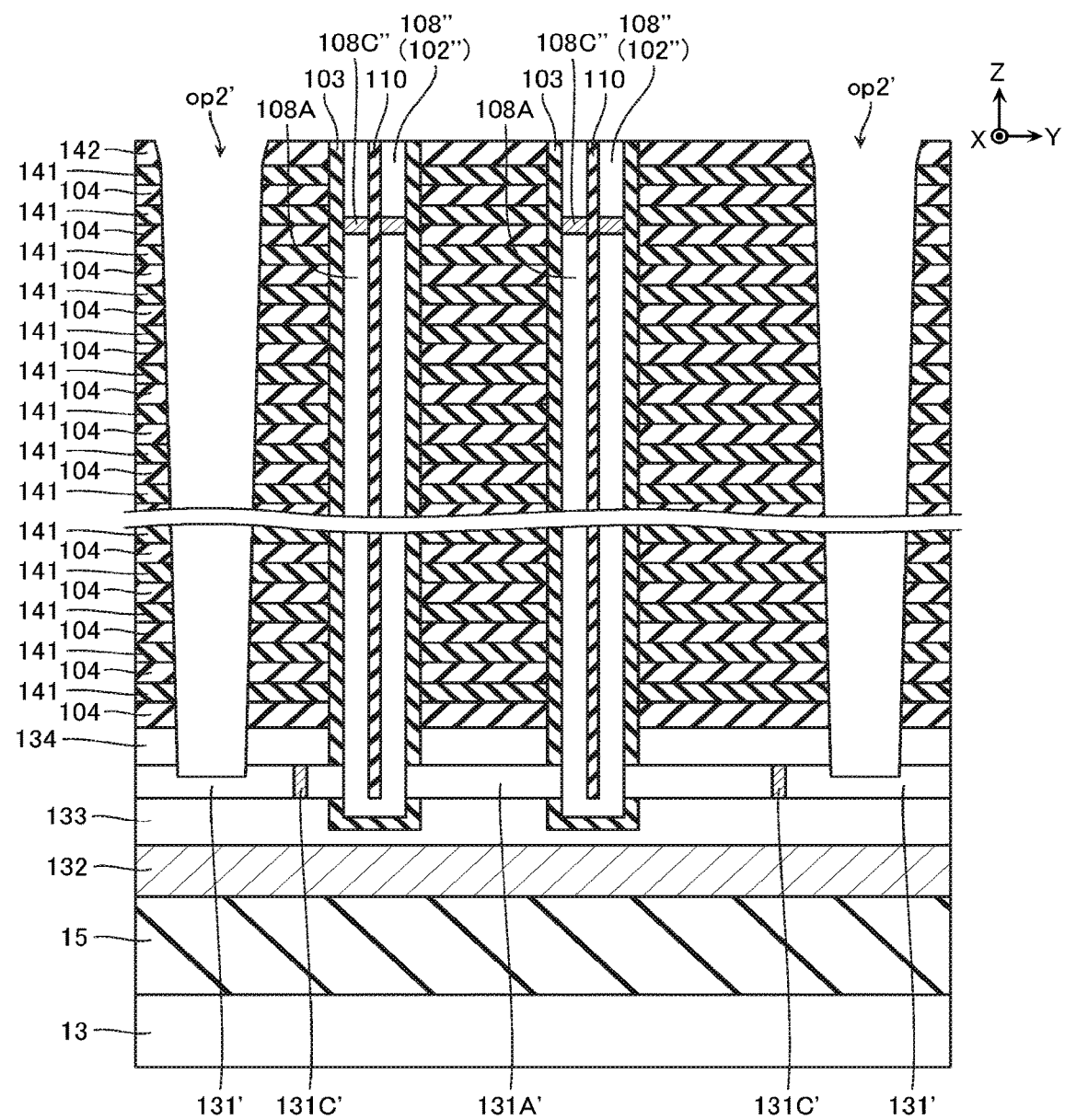
FIG. 41 is a schematic cross-sectional view showing the manufacturing method.
Figure 42:
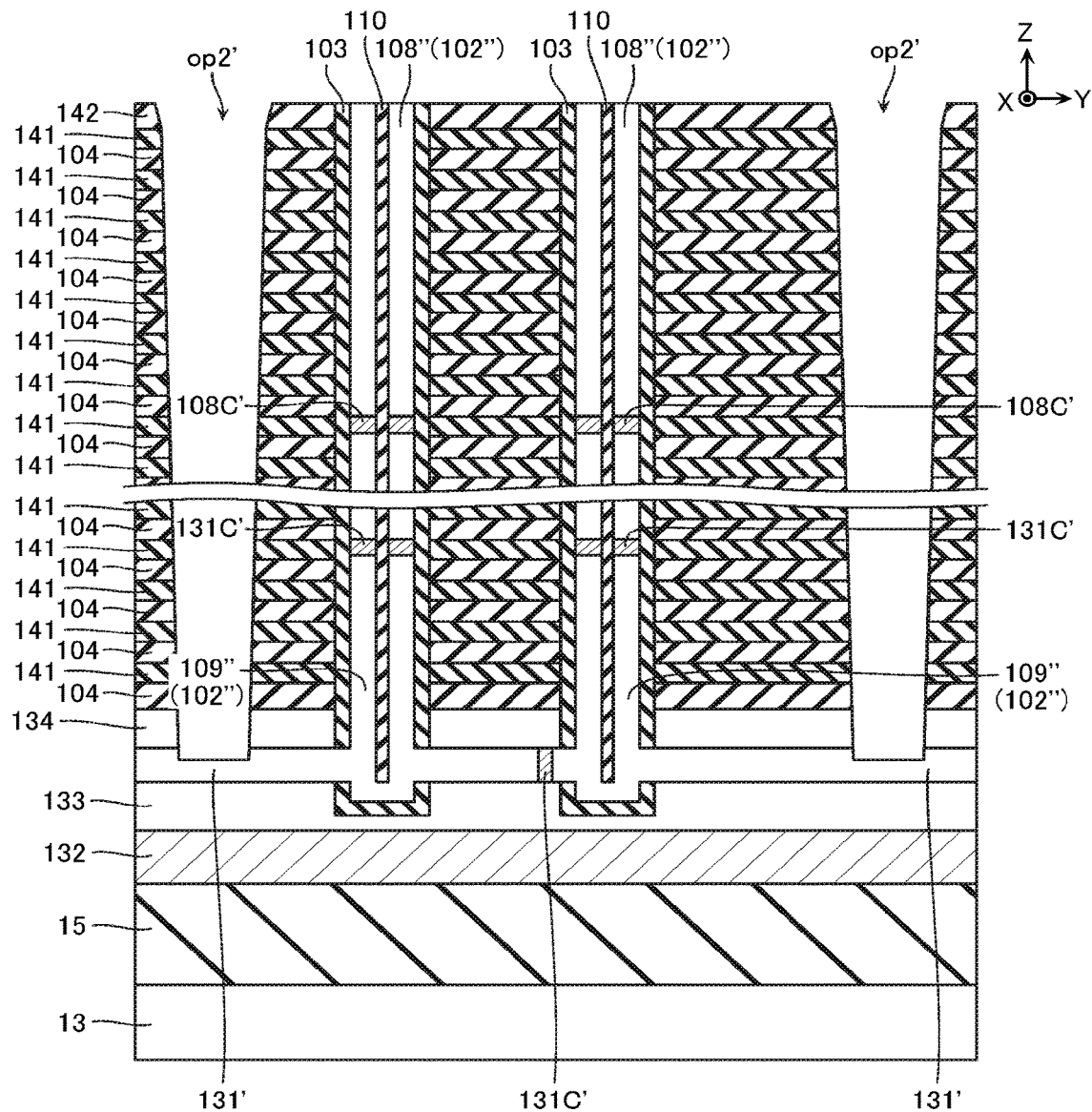
FIG. 42 is a schematic cross-sectional view showing the manufacturing method.

Next, as shown in FIG. 41 and FIG. 42, crystal structures of the amorphous silicon layer 131A' and the amorphous silicon layer 108A are modified by the MILC method described above to form the second semiconductor layer 131' and the first semiconductor layer 102".

In this process, as shown in FIG. 41, silicide layer 131C' proceeds in the Y direction from the openings op2'. The silicide layer 131C' passes through the amorphous silicon layer 131A', and, the second semiconductor layer 131' is formed in portions through which the silicide layer 131C' passed. Moreover, the silicide layer 108C" proceeds downwardly from the upper end of the amorphous silicon layer 108A. The silicide layer 108C" passes through the amorphous silicon layer 108A, and, the first semiconductor layer 102" is formed in portions through which the silicide layers 108C" passed.

Moreover, as shown in FIG. 42, a part of the silicide layer 131C' passes through the amorphous silicon layer 131A' and proceeds to a portion in vicinity of the center of the memory finger MF in the Y direction. On the other hand, another part of the silicide layer 131C' proceeds into the amorphous silicon layer 108A via a contact portion of the amorphous silicon layers 131A' and the amorphous silicon layer 108A, and, proceeds upwardly along with the amorphous silicon layer 108A. The silicide layer 131C' contact with the silicide layer 108C" which have proceeded from the upper end of the amorphous silicon layer 108A.

Then, the sacrifice layers 141 are removed by wet etching or the like via the openings op2', the conductive layers 101 are formed between the insulating layers 104 adjacent in the Z direction, the insulating layers 105 are formed in the openings op2', and, contacts, wirings and the like are formed, thereby manufacturing the semiconductor memory device according to this embodiment.

[Advantages]

According to the semiconductor memory device according to the third embodiment, it is possible to obtain the same advantages as the second embodiment.

Moreover, in the third embodiment, as described with reference to FIG. 41 and FIG. 42, the MILC method is performed in a condition that the amorphous silicon layers 108A which form the first semiconductor layers 102 contacts with the amorphous silicon layers 131A' which form the second semiconductor layer 131'. Thereby, the contact resistance between the first semiconductor layer 102" and the second semiconductor layer 131' can be decreased, and, the resistance in the first semiconductor layers 102" can also be decreased. Note that in a case in which the first semiconductor layers 102" and the second semiconductor layer 131' are formed by such a method, the second crystal grains G2' and the third crystal grains G3' are larger than at least one of the thickness T2 in the Y direction of the first portions 108" and a thickness in the Y direction of the second portion 109". Moreover, the crystal orientation of the second crystal grain G2" and crystal orientations of at least some of the third crystal grains G3' are substantially equal to the crystal orientation of the first crystal grain G1'.

Moreover, in this embodiment, the silicide layers 108C" are formed in the amorphous silicon layers 108A, and, the silicide layers 1080' are used in the MILC method in addition to the silicide layers 131C'. Thereby, compared with a case where the MILC method is performed, for example, using only the silicide layers 131C', time required for this process can be decreased approximately to a half. Note that in case that the first semiconductor layer 102" is formed by such a method, the crystal orientations of the third crystal grains G3" (the fourth crystal grains) formed by the silicide layers 1080' are substantially equal each other. Moreover, the crystal orientations of the third crystal grains G3" formed by the silicide layers 1310" 108C" are substantially equal to the crystal orientation of the second crystal grain G2".

Other Embodiments

As mentioned above, although the first to third embodiments are described, the description above is merely examples, and, the above-mentioned configuration, process and the like can be suitably modified.

For example, in the first embodiment, it is possible to forma silicide layer via openings opt (FIG. 19), and, to perform the MILC method similarly to the second embodiment by using the silicide layer. In this case, it is possible to omit the MILC method after the formation of the amorphous silicon layer 131A (see FIG. 7-FIG. 10), the epitaxial growth method (see FIG. 13), the annealing treatment after the formation of the amorphous silicon layer 108A (see FIG. 17) and the like, for example.

Moreover, in the first embodiment, similarly to the third embodiment, for example, it is also possible to form the silicide layer in the upper end of the amorphous silicon layer 108A, and, to perform the MILC method by using the silicide layer. Also in this case, it is possible to omit the above-mentioned processing. Note that, in this case, similarly to the third embodiment, it is also possible to form silicide layers in both of the amorphous silicon layer 131A and the amorphous silicon layer 108A, and, to perform the MILC method by using these silicide layers.

Moreover, for example, in the second and third embodiments, it is possible to modify crystal structures of at least one of the third semiconductor layer 133 and the fourth semiconductor layer 134 by the MILC method. In this case, the third semiconductor layer 133 may include a crystal grain larger than the thickness T3 in the Z direction of the third semiconductor layer 133. Moreover, the fourth semiconductor layer 134 may include a crystal grain larger than the thickness T4 in the Z direction of the fourth semiconductor layer 134.

Moreover, in the third embodiment, in the process shown in FIG. 40, silicide layers are formed in both of the amorphous silicon layer 131A' and the amorphous silicon layer 108A. However, it is also possible to omit silicide formation of one of the amorphous silicon layer 131A' and the amorphous silicon layer 108A.

[Others]

While certain embodiments have been described, these embodiments have been presented by way of example only, and, are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate;
a plurality of gate electrodes arranged in a first direction crossing a surface of the substrate;
a first semiconductor layer including a first portion extending in the first direction and facing the plurality of gate electrodes, and, a second portion nearer to the substrate than the first portion;
a gate insulating film provided between the plurality of gate electrodes and the first portion of the first semiconductor layer, and, including a memory portion; and
a wiring portion provided between the substrate and the plurality of gate electrodes, connected to the second portion of the first semiconductor layer, and, extending in a second direction crossing the first direction,
the wiring portion comprising:
a second semiconductor layer connected to the second portion of the first semiconductor layer;
a metal layer provided between the substrate and the second semiconductor layer;
a third semiconductor layer provided between the second semiconductor layer and the metal layer; and
a fourth semiconductor layer provided between the second semiconductor layer and the plurality of gate electrodes, wherein
the second semiconductor layer includes a first crystal grain larger than a thickness of the second semiconductor layer in the first direction.

2. The semiconductor memory device according to claim 1, wherein the second semiconductor layer includes metal atoms of at least one of nickel (Ni), cobalt (Co), aluminum (Al) and palladium (Pd).

3. The semiconductor memory device according to claim 1, wherein
the second semiconductor layer is farther from the substrate than one end of the first semiconductor layer in the first direction, and
the first crystal grain is connected to a side surface of the first semiconductor layer in the second direction.

4. The semiconductor memory device according to claim 1, wherein an average size of the crystal grains in the third semiconductor layer and an average size of the crystal grains in the fourth semiconductor layer are smaller than an average size of the crystal grains in the second semiconductor layer.

5. The semiconductor memory device according to claim 1, wherein the largest crystal grain in the third semiconductor layer and the fourth semiconductor layer is smaller than the first crystal grain.

6. A semiconductor memory device comprising:
a substrate;
a plurality of gate electrodes arranged in a first direction crossing a surface of the substrate;
a first semiconductor layer including a first portion extending in the first direction and facing the plurality of gate electrodes, and, a second portion nearer to the substrate than the first portion;
a gate insulating film provided between the gate electrode and the first portion of the first semiconductor layer, and, including a memory portion;
a wiring portion provided between the substrate and the plurality of gate electrodes, connected to the second portion of the first semiconductor layer, and, extending in a second direction crossing the first direction; and
first and second insulating layers extending in the first direction, connected to the wiring portion, and, including a portion facing the plurality of gate electrodes, wherein
the wiring portion comprises a second semiconductor layer connected to the second portion of the first semiconductor layer and to the first and second insulating layers,
the second semiconductor layer includes a plurality of first crystal grains, the first crystal grains being larger than a thickness of the second semiconductor layer in the first direction, one of the plurality of the first crystal grains being a second crystal grain corresponding to the first insulating layer, and, another of the plurality of the first crystal grains being a third crystal grain corresponding to the second insulating layer, and
a grain boundary between the fifth crystal grain and the sixth crystal grain is provided between the first and second insulating layers in the second direction.

7. The semiconductor memory device according to claim 6, wherein the second semiconductor layer includes metal atoms of at least one of nickel (Ni), cobalt (Co), aluminum (Al), and palladium (Pd).

8. The semiconductor memory device according to claim 6, wherein
the second semiconductor layer is farther from the substrate than one end of the first semiconductor layer in the first direction, and
the first crystal grain is connected to a side surface of the first semiconductor layer in the second direction.

9. The semiconductor memory device according to claim 6, wherein the wiring portion further includes a metal layer provided between the substrate and the second semiconductor layer.

10. The semiconductor memory device according to claim 9, wherein the metal layer is provided on a surface of the second semiconductor layer closest to the substrate.

* * * * *